United States Patent
Takizawa et al.

[11] Patent Number: 5,795,686
[45] Date of Patent: Aug. 18, 1998

[54] PATTERN FORMING METHOD AND METHOD OF MANUFACTURING LIQUID CRYSTAL DISPLAY DEVICE

[75] Inventors: Hideaki Takizawa; Shougo Hayashi, both of Kawasaki, Japan

[73] Assignee: Fujitsu Limited, Kawasaki, Japan

[21] Appl. No.: 770,231

[22] Filed: Dec. 19, 1996

[30] Foreign Application Priority Data

Dec. 26, 1995 [JP] Japan .................. 7-339594

[51] Int. Cl.$^6$ .................. G03F 9/00; G03F 7/00
[52] U.S. Cl. .................. 430/5; 430/22; 430/312; 430/321; 430/323; 430/324; 355/77
[58] Field of Search .................. 430/5, 22, 312, 430/319, 321, 322, 323, 325, 394, 396; 355/77

[56] References Cited

U.S. PATENT DOCUMENTS

| | | | |
|---|---|---|---|
| 5,286,584 | 2/1994 | Gemmink et al. | 430/5 |
| 5,298,761 | 3/1994 | Aoki et al. | 250/548 |
| 5,437,946 | 8/1995 | McLoy | 430/5 |
| 5,573,634 | 11/1996 | Ham | 156/659.11 |

*Primary Examiner*—John A. McPherson
*Attorney, Agent, or Firm*—Greer, Burns & Crain, Ltd.

[57] ABSTRACT

A pattern forming method of forming an overall pattern by connecting a plurality of pattern forming regions. The pattern forming method includes the steps of (A) forming, using a first exposure mask (RT11a), a plurality of latent images of first patterns arranged regularly in a photosensitive resist film (52) on a first region while forming unexposed regions having a size in which one or more of the first patterns are included and latent images of the first patterns in it on a third region (JT1), and (B) forming, using a second exposure mask (RT11b), a plurality of latent images of the first patterns arranged regularly in the photosensitive resist film (52) on a second region while forming latent images of the first patterns in the unexposed regions on the third region (JT1).

20 Claims, 22 Drawing Sheets

PATTERN FORMING METHOD AND METHOD OF MANUFACTURING LIQUID CRYSTAL DISPLAY DEVICE

BACKGROUND OF THE INVENTION

1. Field of the Invention

The present invention relates to a pattern forming method of forming an overall pattern by connecting plurality of pattern forming regions, and a method of manufacturing a liquid crystal display device.

2. Description of the Prior Art

In recent years, a TFT (thin film transistor) matrix liquid crystal color display device has been widely spread as a display for a personal computer and a wall-mounted television set. In connection with manufacturing yield of the TFT matrix to drive the liquid crystal, etc., most of the liquid crystal display devices have a small screen at present. However, in order to aim at wide spread of the liquid crystal display with a wide screen in future, trials of technical development and product have been carried out eagerly.

For manufacture of the display device at low cost, it is important to form the TFT matrix in less numbers of processes and with good yield. Therefore, a photolithography technology with the use of a reticle (an exposure mask) which permits a large number of patterns to be transferred simultaneously has become the main current. One reticle (referred to as one layer) per one patterning step is generally used.

However, since the display device with a larger screen needs a substrate in larger size, it becomes difficult to transfer all patterns of one layer at once owing to the structure of the exposure device. Therefore, after an entire pattern region of one layer is divided into a plurality of partial regions, a plurality of reticles are prepared for respective partial regions correspondingly. If an overall pattern is to be formed, then partial regions other than partial regions to be exposed are light-shielded on the resist film, and then such overall pattern is formed by exposing respective partial regions one after the other.

FIG. 1 shows a TFT matrix formed on a glass substrate. Although the number of pixel is simplified in FIG. 1, pixels (PXL) driven by TFT are arranged in a 6 column×6 row matrix fashion. Left partial region PR1 and right partial region PR2 with respect to a center boundary line (BL) by a dotted line in FIG. 1 are formed individually respectively. A set of two reticles RT1, RT2 on which partial regions PR1, PR2 are formed respectively as shown in FIG. 2 is utilized for each layer. The boundary line is formed as a straight line because of easy digitization.

FIGS. 3A and 3B are sectional views respectively the left partial region PR1 and the right partial region PR2 of TFT. As shown in FIGS. 3A and 3B, a source electrode 8a and a drain electrode 8b are formed to extend on a gate electrode 2 by the reason of alignment precision. Therefore, as shown in an equivalent circuit diagram per pixel in FIG. 4A, floating capacitance Cgs is caused by overlap of the source electrode 8a and the gate electrode 2. As a result, as shown in FIG. 4B, charges which flow from the drain D to source S when the gate is opened flow out to gate bus line via the floating capacitance Cgs after the gate is closed, so that source voltage VS, i.e., pixel potential is reduced. In order to suppress reduction in pixel potential, it is desired to make the floating capacitance Cgs as small as possible.

In some cases TFT on the left partial region PR1 and TFT on the right partial region PR2 have different overlap widths ΔW between the source electrode 8a and the gate electrode 2 if reticles are aligned separately at the partial regions PR1, PR2. In this case, because of different floating capacitance Cgs of TFTs in the partial regions PR1, PR2, there is a difference ΔV between the respective source voltages VS in the partial regions PR1, PR2 and in turn is a difference ΔT between the respective transmittances in them, as shown in FIG. 5. Consequently, brightness difference is caused to generate disuniformity on the display.

SUMMARY OF THE INVENTION

It is an object of the present invention to provide a pattern forming method capable of arranging patterns as for different exposure masks mixedly in pattern joint portion without lack of regularity when an overall pattern in which jointed partial patterns are arranged regularly is formed with the use of plural sheets of exposure masks.

It is another object of the present invention to provide a TFT assembling device manufacturing method capable of arranging electrodes, etc. as for different exposure masks mixedly in pattern joint portion without lack of regularity when an overall pattern in which jointed partial patterns are arranged regularly is formed with the use of plural sheets of exposure masks.

It is still another object of the present invention to provide a liquid crystal display device manufacturing method capable of preventing disuniformity on the screen of the display when an overall pattern in which jointed partial patterns are arranged regularly is formed with the use of plural sheets of exposure masks.

It is still another object of the present invention to provide a set of exposure masks made up of plural sheets of exposure masks capable of arranging patterns as for different exposure masks mixedly in joint portion without lack of regularity when an overall pattern in which jointed partial patterns are arranged regularly is formed with the use of plural sheets of exposure masks.

In the pattern forming method of the present invention, first latent images of the first pattern and unexposed regions in which the first pattern may be included are formed, using the first exposure mask, in the photosensitive resist mask in the third region which is put between the first and second regions wherein latent images of the first patterns are formed regularly. Thereafter, using the second exposure mask, latent images of the first patterns are formed regularly in the second region and latent images of the first patterns are formed in the unexposed regions.

In other words, at first unexposed regions are formed in the area where the first patterns are to be arranged, then latent images of the first patterns are formed therein. For this reason, in the pattern joint portion (third region), the first pattern enables latent images of the first patterns according to different exposure masks to be arranged mixedly without loss of regularity.

Accordingly, the first patterns made of photosensitive resist film are formed by developing latent images of the first patterns, then the second patterns are formed using the first patterns as a mask. In pattern joint portion, patterns according to different exposure masks may be arranged mixedly without loss of regularity.

In a set of exposure masks according to the present invention capable of attaining the above, patterns and light-shielding films in B and D regions are arranged so that patterns in one of the two regions and light-shielding films in the other are superimposed with each other.

In the thin film transistor assembly device manufacturing method, the electrodes arranged regularly are formed in the similar manner to the above. Therefore, in pattern joint portion, the electrodes according to different exposure masks may be arranged mixedly without loss of regularity. Beside, the substrate in claims on which a photosensitive resist film is formed is the very silicon substrate or glass substrate, or the substance that insulating films or conductive films for formation of electrodes or both are formed on the silicon substrate or glass substrate.

Meanwhile, visual capability of the human being is insensitive to difference in optical brightness between two discrete points, but, if plural points with difference in optical brightness are located adjacently as a group, it has excellent ability to recognize the boundary between them. Therefore, in the liquid crystal display device, when pixels with different brightness are aligned on a straight line, visual capability of the human eye may perceive easily such different brightness as display disuniformity. On the contrary, since human eyes cannot discriminate red, green, blue pixels separated by a distance of about 1/10 to 2/10 mm, display disuniformity cannot be perceived visually if portions with difference in brightness are separated within the above distance so as to avoid regular arrangement as a group.

In the liquid crystal display device manufacturing method, source and drain regions are formed by the same way as the thin film transistor assembling device manufacturing method of the present invention. Therefore, in pattern joint portion, electrodes, etc. according to different exposure masks may be arranged mixedly without loss of regularity.

For instance, in the entire jointed patterns, the boundary line between the source and drain electrodes according to different exposure masks is a zigzagged line, for example, like a path bending at a right angle at the corner.

Otherwise, the source and drain electrodes forming regions according to different exposure masks are arranged alternatively in the vertical and lateral directions.

Consequently, even if alignment is shifted upon forming latent images of the electrode patterns and thereby Cgs becomes different in electrode forming regions according to different exposure masks, in the joint portion (third region) between electrode forming regions according to different exposure masks, portions with difference in brightness caused by difference in Cgs are not arranged on a straight line or the boundary between them becomes unclear. As a result, display disuniformity cannot be perceived visually by the human eyes.

Particularly, in the jointed portions between the pattern forming regions, if size of the pattern forming regions according to at least one of different exposure masks is less than the pattern resolution which can be perceived visually by the human eyes, then display disuniformity cannot be perceived more effectively by the human eyes.

Namely, for example, since the boundary line between the patterns belonging to different exposure masks is formed as a zigzag line, the patterns according to different exposure masks are tangled and mixed in pattern joint portion. In this case, since the size of the pattern forming regions according to at least one of different exposure masks becomes less than the pattern resolution perceived visually by the human eyes, the boundary between the pattern forming regions becomes vague visually to the human eyes. For this reason, in the event that the jointed patterns are applied to the TFT matrix device in the liquid crystal display device, the clear boundary line between pattern forming regions according to different exposure masks cannot be perceived even if difference in brightness occurs between them.

This fact is similarly true of the case wherein, in the joint portion of the entire patterns, the pattern forming regions according to different exposure masks are arranged alternatively in the vertical and lateral directions. That is, since the pattern forming regions according to different exposure masks are mixed in the joint portions, the difference in brightness in the joint portions is relaxed even if difference in brightness occurs between pattern forming regions according to different exposure masks. For this reason, since brightness looks like it is shifted gradually, display disuniformity cannot be perceived visually by the human eyes.

DESCRIPTION OF THE PREFERRED EMBODIMENTS

Various embodiments of the present invention will be explained with reference to the accompanying drawings hereinbelow.

(1) First to Third Embodiments

Figure 6:
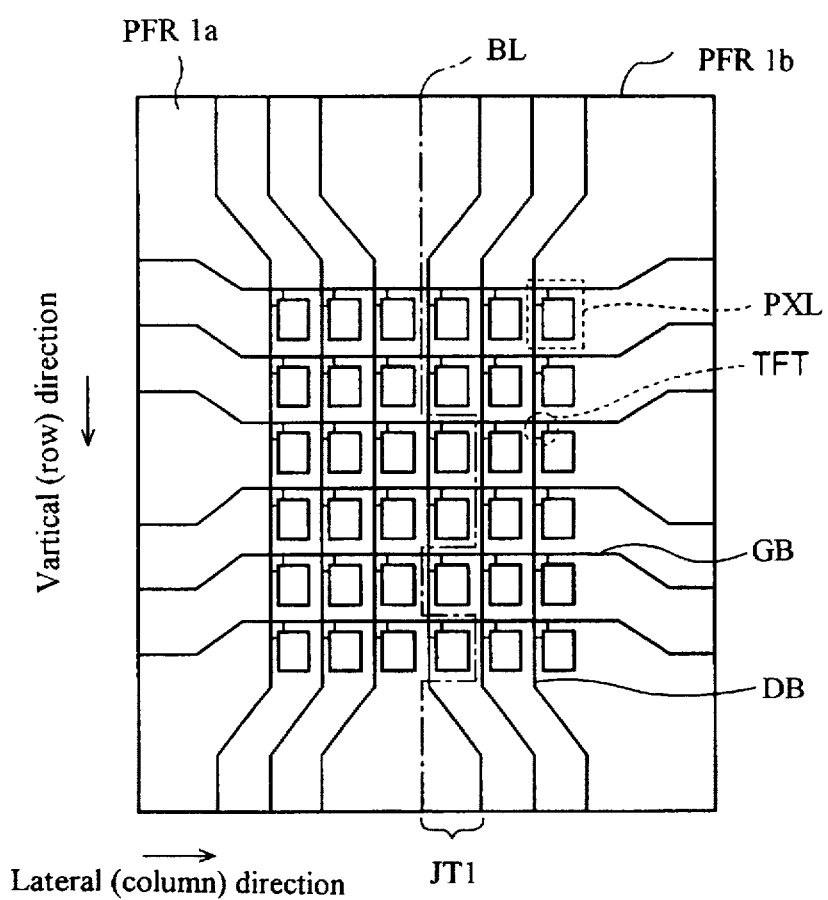
FIG. 6 is a plan view showing a TFT matrix device and a part of a liquid crystal display device applying it according to first through third embodiments of the present invention.
Figure 20:
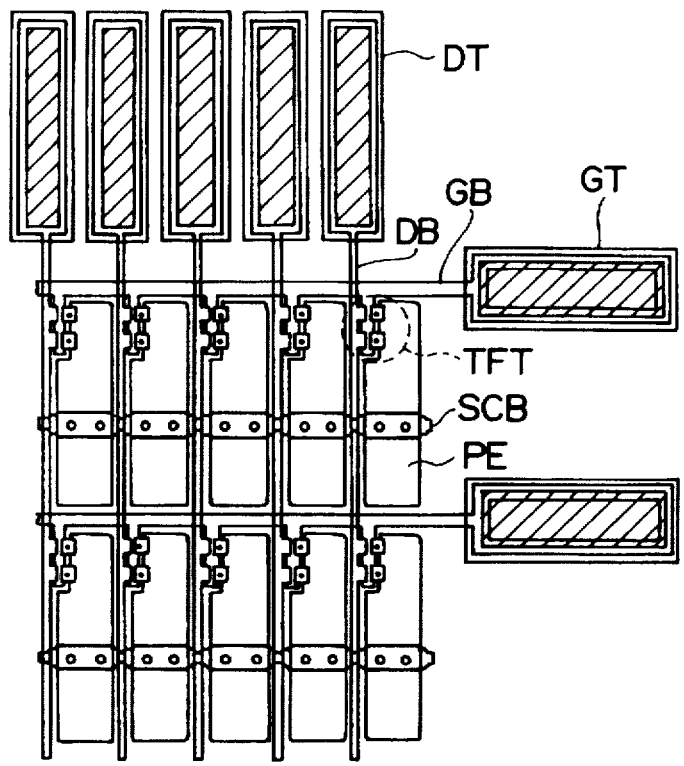
FIG. 20 is an enlarged plan view showing the TFT matrix device and a part of the liquid crystal display device applying it according to embodiments of the present invention.
Figure 21:
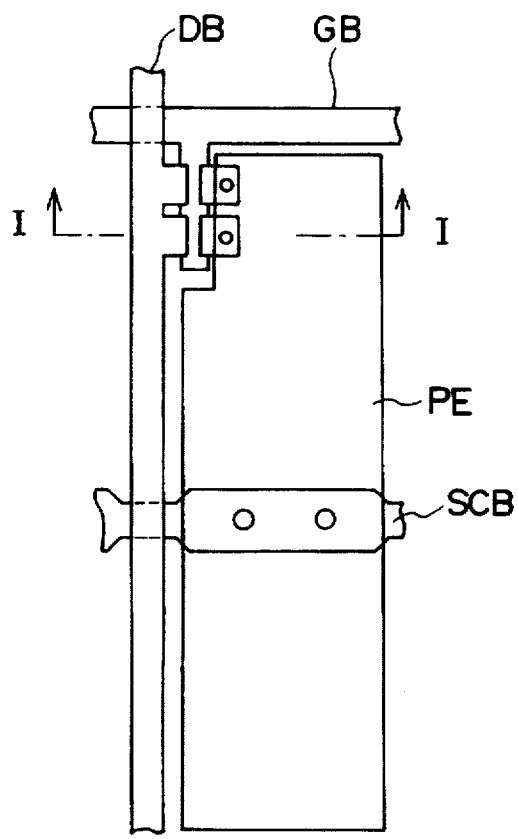
FIG. 21 is an enlarged plan view showing one pixel of the liquid crystal display device applying the TFT matrix device according to embodiments of the present invention.

FIG. 6 is a plan view showing a TFT matrix device according to the first through the third embodiments of the present invention. FIG. 20 is a partially enlarged plan view showing the TFT matrix device, and FIG. 21 is an enlarged plan view showing one pixel. FIG. 22F is a sectional view, taken along a line I–I in FIG. 21, showing details of a part of TFT in pixel.

In FIG. 6, although the number of pixel (PXL) is simplified, pixels including a TFT are arranged in a 6 column×6 row matrix fashion. Vertical and lateral dimensions of one pixel is substantially 100 μm×100 μm. Size of a pixel can be varied if necessary.

As shown in FIGS. 6 and 20, a plurality of gate bus lines GB extend in the lateral direction while a plurality of drain bus lines DB extend in the vertical direction. At each intersecting point between these bus lines, one TFT and one pixel electrode PE connected to a source region of the TFT are provided.

In addition, a gate terminal GT and a drain terminal DT are provided at the end portions of respective bus lines GB, DB.

Further, a common electrode SCB is provided in parallel to the gate bus line GB and across the central portion of the pixel electrode PE so as to contact with the pixel electrode PE.

An entire pattern of the TFT matrix device in FIG. 6 is split by a zigzag boundary line (BL) indicated by a dot-dash line. This boundary line is positioned in a pattern joint portion (JT1, the third region) around the central portion of the entire pattern. A left partial region PFR1a and a right partial region PFR1b with respect to the boundary line are formed by different patterning steps.

A detailed sectional structure of the TFT portion in the pixel in FIG. 21 is shown in FIG. 22F. The TFT is of inverse stagger type.

As shown in FIG. 22F, a gate electrode 12 is formed on a glass substrate 11. An insulating film 13 made of a silicon nitride film is formed to coat this gate electrode 12. A channel layer 14a made of amorphous silicon (a-Si) film is formed on the insulating film 13 to extend from the area over the gate electrode 12 to both sides.

An insulating film 15a made of a silicon nitride film is formed on the channel layer 14a and over the gate electrode 12. Openings are formed in the insulating film 15a on the channel layer 14a above both sides of the gate electrode 12 respectively. The channel layer 14a contacts a two-layered source electrode 20a consisting of an n+ type a-Si film 16a and a metal film 17a and a two-layered drain electrode 20b consisting of an n+ type a-Si film 16b and a metal film 17b via the openings.

The source electrode 20a and the drain electrode 20b are formed larger in size than the openings for complementing alignment precision. The source electrode 20a and the drain electrode 20b extend to the area over the gate electrode 12 and are overlapped with both end portions of the gate electrode 12 via the insulating film 13, the a-Si film 14a, and the insulating film 15a. The source electrode 20a and the drain electrode 20b are coated with an insulating film 21. A pixel electrode 22 contacts the source electrode 20a via the opening which is formed in the insulating film 21.

Figure 23:
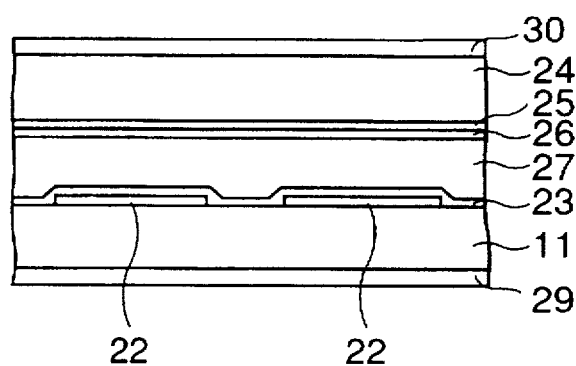
FIG. 23 is a plan view showing the liquid crystal display device using the TFT matrix device according to embodiments of the present invention.

As being well known, in a liquid crystal display device employing this TFT matrix, an alignment film 23 is formed on the pixel electrode 22. As shown in FIG. 23, another glass substrate 24 on which another transparent common electrode 25 and an alignment film 26 are formed, is overlapped with the glass substrate 11 so as to put a liquid crystal 27 therebetween. In addition, polarization plates 29, 30 are provided on back surfaces of the glass substrates 11, 24.

Figure 25:
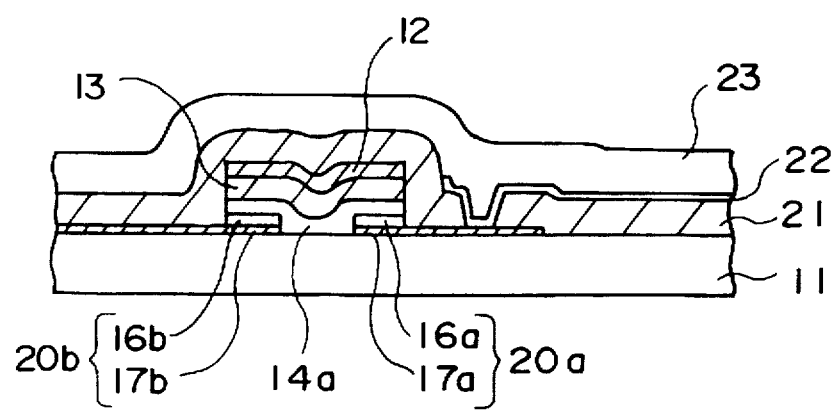
FIG. 25 is a plan view showing the TFT matrix device of the stagger type and a part of the liquid crystal display device using it according to embodiments of the present invention.

In the above embodiment, though the present invention is applied to the TFT matrix device of the inverse stagger type, it may be applied to a TFT matrix device of a stagger type as shown in FIG. 25 as well. In FIG. 25, elements which are shown with same symbols as that in FIG. 22F indicate same elements in FIG. 22F.

Subsequently, a reticle (an exposure mask) used in manufacturing the TFT matrix device, etc. according to the first embodiment will be explained.

Figure 7:
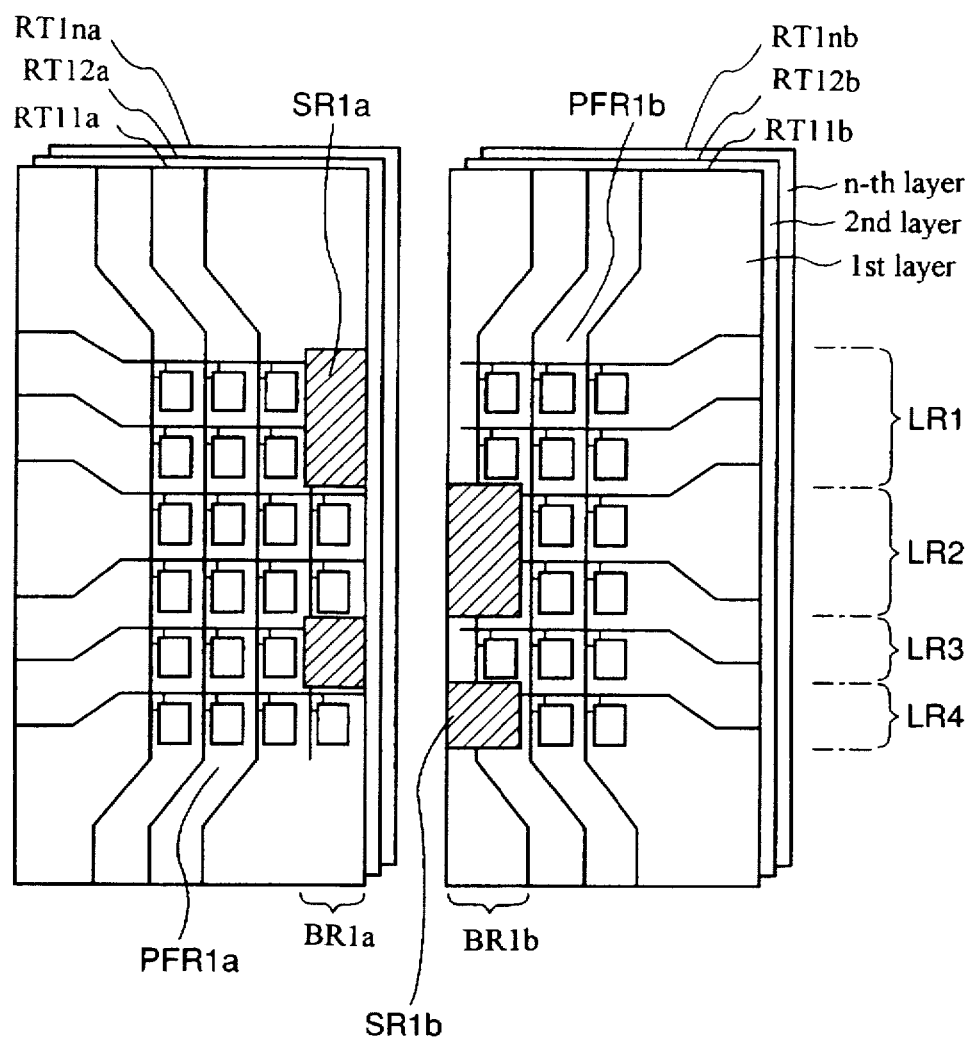
FIG. 7 is a plan view showing reticles according to the first embodiment of the present invention.

FIG. 7 is a plan view showing plural sets of two reticles (RT11a, RT11b), (RT12a, RT12b), . . . , (RT1na, RT1nb) from the first layer to the n-th layer. The TFT matrix pattern shown in FIG. 6 is formed by repeating patterning process n times with the use of the reticles (RT11a, RT11b), (RT12a, RT12b), . . . , (RT1na, RT1nb) formed as n layers. The first layer to the n-th layer indicate respective sets of reticles for forming respective layers such as gate electrodes, source and drain electrodes, openings and so on by respective patterning processes.

In FIG. 7, an arrangement of pixel patterns on the reticles RT11a, RT11b of the first layer is shown representative of the reticles of the first layer to the n-th layer. As shown in FIG. 7, pattern forming regions PFR1a, PFR1b which are split into two right and left partial regions are formed on two reticles RT11a, RT11b of the first layer. The patterns on the reticles RT11a, RT11b of the first layer are not actual patterns, but, for the sake of simplicity of explanation, show overlapped patterns which are obtained by superimposing the reticles from the first layer to the n-th layer to coincide with those in FIG. 6.

Patterns with the same profile are aligned vertically and laterally on two reticles RT11a, RT11b of the first layer. Light shielding regions (light shielding films) SR1a, SR1b serving as pattern non-forming regions are provided along the boundary portion between the reticles RT11a, RT11b. The light shielding regions SR1a, SR1b are formed to have a size of one pixel pattern in the lateral (row) direction and a size of one or two pixel patterns in the vertical (column) direction. Besides, though light-shielding belts are actually formed in the belt-shaped regions of approximately 1.5 mm in width between the reticle edges and the periphery of the rectangular region in which the pattern forming regions PFR1a, PFR1b and light shielding regions SR1a, SR1b are formed, they are omitted in FIG. 7 in order to simplify the explanation. This is the same in the drawings of reticles shown below.

Figure 8A:
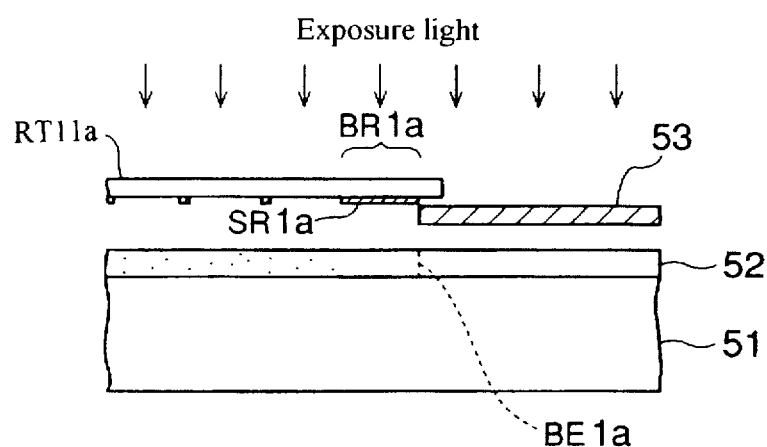
FIG. 8 is a sectional view showing an exposure method using the reticle according to the first embodiment of the present invention.
Figure 8B:
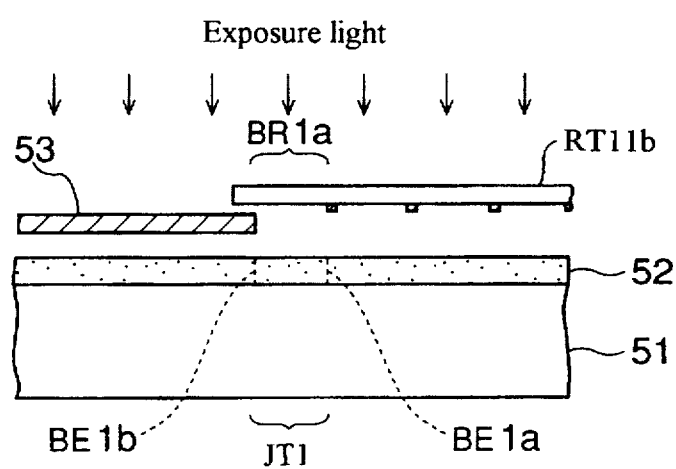

In this case, as shown in FIG. 8A, first the patterns in the pattern forming region PFR1a on the reticle RT11a are transferred as latent images by exposing a photosensitive film 52 after the half area of the photosensitive film 52 on a substance 51 to be patterned is covered with a light-shielding plate 53. Subsequently, as shown in FIG. 8B, the patterns in the pattern forming region PFR1b on the reticle RT11b are transferred as latent images so as to be jointed to the latent images of the patterns of the reticle RT11a transferred previously. At this time, the reticle RT11b and the reticle RT11a transferred previously are overlapped with each other by one pixel size from the boundary edges BE1a, BE1b respectively. In this manner, if the photosensitive film 52 is exposed after the remaining half area of a photosensitive film 52 is covered with the light-shielding plate 53 except for the boundary portion BR1a on the reticle RT11a, then the pattern forming region PFR1b on the reticle RT11b is transferred as latent image on unexposed region corresponding to the light-shielding region SR1a on the reticle RT11a transferred previously and at the same time the pattern forming region PFR1a on the reticle RT11a transferred as latent image previously remains as it is since the region PFR1a has already been covered with the light-shielding region SR1b on the reticle RT11b.

An overall pattern jointed as above has following pattern arrangement belonging to the reticles RT11a, RT11b every row, as shown in FIG. 6. That is, (left three columns and right three columns), (left three columns and right three columns), (left four columns and right two columns), (left four columns and right two columns), (left three columns and right three columns), and (left four columns and right two columns) are aligned in order from the uppermost row.

Like the aforementioned, in the overall jointed pattern, the boundary line between pattern forming regions PFR1a, PFR1b is zigzagged like as a path bending at a right angle at the corner. Furthermore, widths of projected portions and recess portions LR1 to LR4 in the column direction are less than 200 μm, i.e., less than pattern resolution by virtue of the human naked eye. Where "pattern resolution" means such a pattern size that pattern profile can be clearly perceived visually by the naked human eye.

Though split in the vertical direction in the above, the patterns may be split in the lateral direction. In this case, the light-shielding regions acting as the pattern non-forming regions are also provided on the boundary area such that the boundary line between the pattern forming regions forms a zigzagged line bending at a right angle at a corner.

Figure 9:
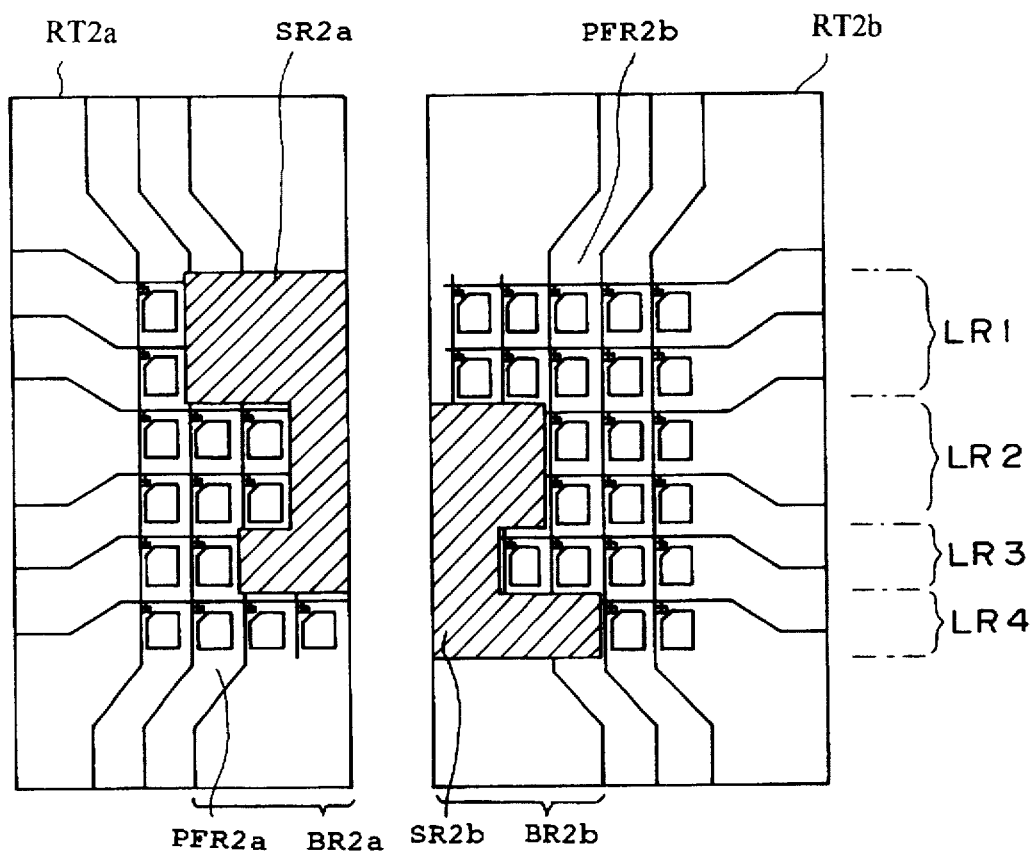
FIG. 9 is a plan view showing a reticle according to the second embodiment of the present invention.
Figure 10:
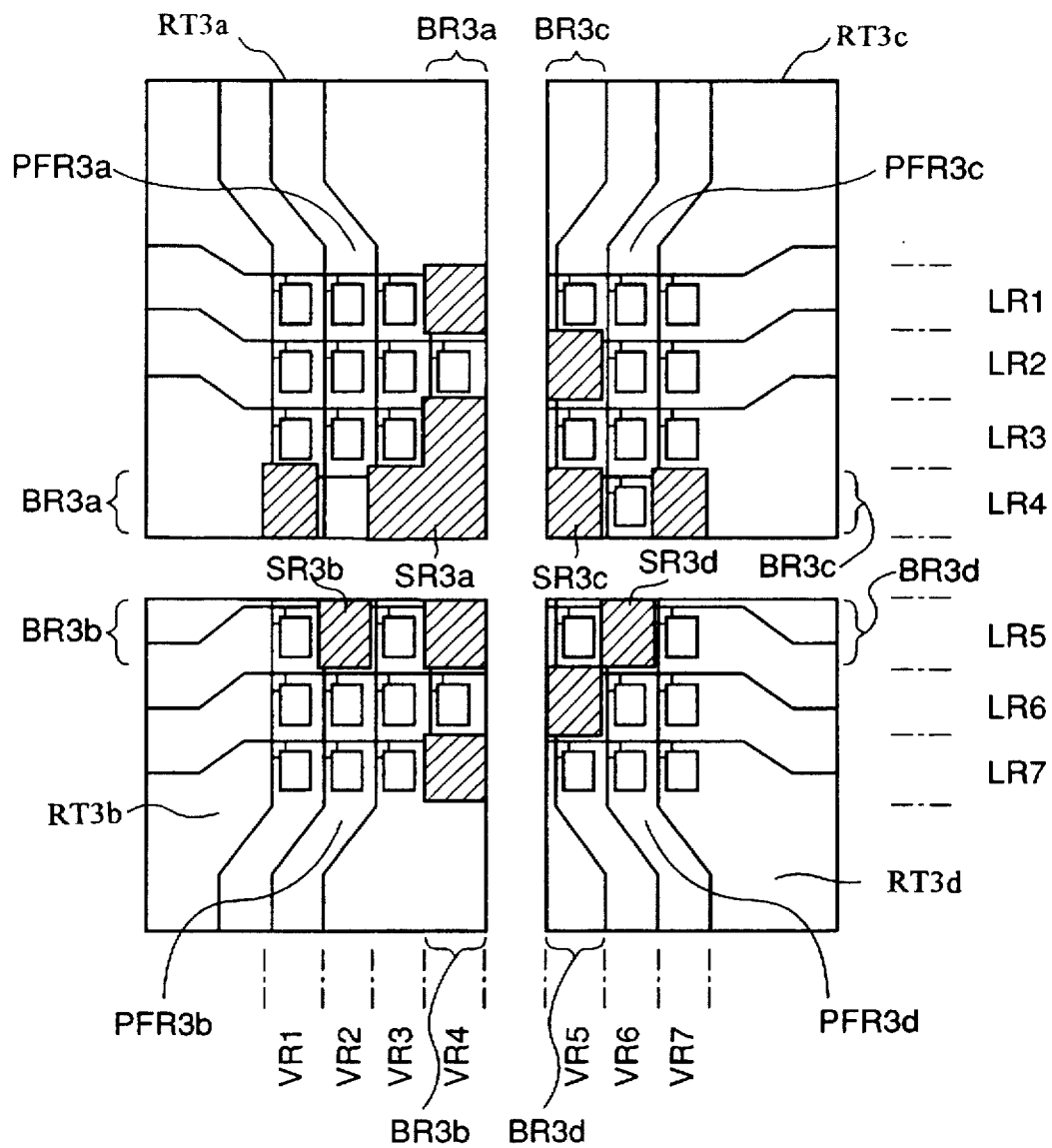
FIG. 10 is a plan view showing a reticle according to the third embodiment of the present invention.

As stated earlier, for the case where the boundary line between the pattern forming regions PFR1a, PFR1b is a zigzagged line, the second embodiment of pattern arrangements on the reticle is shown in FIG. 9 and the third embodiment is shown in FIG. 10.

FIG. 9 shows patterns on the reticle of any layer. Like the case in FIG. 7, this reticle is also split into two right and left portions 2a, 2b. The pattern forming regions PFR2a, 2b and the pattern non-forming regions (light-shielding regions SR2a, SR2b) are arranged in the boundary portions BR2a, BR2b of split reticles RT2a, RT2b so as to be aligned alternatively in the vertical direction.

In this case, unlike the case in FIG. 7, when the reticle RT2b is overlapped with the reticle RT2a on which the patterns are transferred previously by three pixel patterns from the boundary edges between the reticles RT2a, RT2b and the patterns on the reticle RT2b are to be transferred, the pattern forming region PFR2a on the reticle RT2a transferred previously remain as it is because it is covered with the light-shielding region SR2b on the reticle RT2b whereas the pattern forming region PFR2b on the reticle RT2b is transferred on the unexposed region corresponding to the light-shielding region SR2a on the reticle RT2a transferred previously.

In the entire pattern formed in this manner, as pattern arrangement belonging to respective reticles per each row, (left one column and right five columns), (left one column and right five columns), (left three columns and right three columns), (left three columns and right three columns), (left two columns and right four columns), and (left four columns and right two columns) are aligned in sequence from the uppermost row.

FIG. 10 shows patterns on a set of four reticle 3a to 3d of any layer. An overall pattern is split into four portions, i.e., upper left portion, lower left portion, upper right portion, and lower right portion. Pattern forming regions PFR3a to PFR3d and light-shielding regions SR3a to SR3d are arranged so as to be aligned alternatively in the column direction at the vertical boundary portion of reticles RT3a to RT3d and in the row direction at the lateral boundary portion thereof.

In this case, the reticles RT3a to RT3d are overlapped mutually by one pixel pattern from their boundary edges. In other words, if regions LR4, LR5 and regions VR4, VR5 are overlapped with each other, then pattern arrangement belonging to respective reticles RT3a to RT3d are aligned like (upper left three columns and upper right three columns), (upper left four columns and upper right two columns), (upper left three columns and upper right three columns), (lower left one column-upper left column-lower left one column and lower right one column-upper right one column-lower right one column), (lower left four columns and lower right two columns), and (lower left three columns and lower right three columns) in sequence from the uppermost row.

Next, a TFT matrix device manufacturing method using the reticles in FIG. 7 and a liquid crystal display device manufacturing method will be explained with reference to FIGS. 22A to 22F.

FIGS. 22A to 22F are sectional views showing manufacturing steps of the TFT matrix device, and show a sectional portion taken along a line I—I in FIG. 21 in compliance with manufacturing steps. Although patterning steps using one of two split reticles are depicted merely in FIGS. 22A to 22F, patterning steps using the other are omitted from the drawings because they are similar to those in FIGS. 22A to 22F.

Figure 22A:
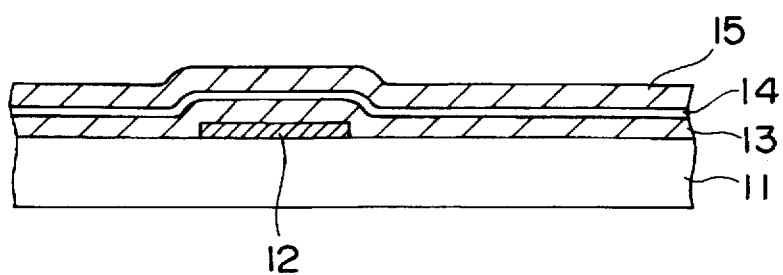
FIGS. 22A to 22F are sectional views showing the method of manufacturing the TFT matrix device and a part of the liquid crystal display device applying it according to embodiments of the present invention.

First, as shown in FIG. 22A, a refractory metal film is formed on a glass substrate 11. Then, a resist film (not shown) is formed, then a resultant structure is exposed by using the reticle 11a in FIG. 7 on which the pattern of the first layer is formed so that patterns are transferred on the resist film.

Subsequently, by making use of other reticle RT11b to be combined with the reticle RT11a, the reticle RT11a transferred previously and the reticle RT11b are aligned so as to be overlapped with each other by one pixel pattern from their boundary edges, and then a resultant structure is exposed.

In the next figure, a resist mask is formed by developing the resist film. The refractory metal film is etched with the use of this resist mask to form a gate electrode 12.

Figure 22B:
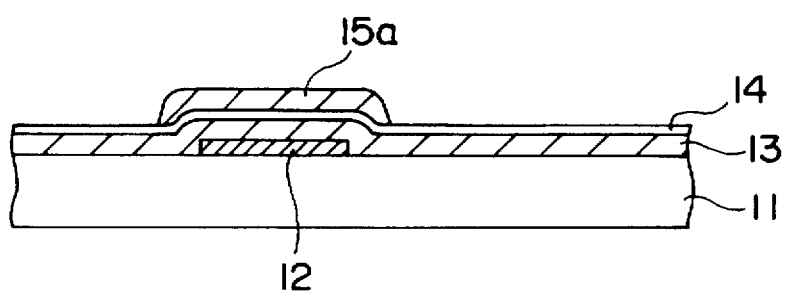

Then, a silicon nitride film 13, an a-Si film 14, and a silicon nitride film 15 are formed in sequence covering the gate electrode 12. Then, as shown in FIG. 22B, in the similar manner to those in FIG. 22A, a resist mask is formed by a photolithography technique with the use of the reticles RT12a, RT12b of the second layer of the reticles shown in FIG. 7. Following this, the silicon nitride film 15 of the uppermost layer is etched by a dry etching technique using the resist mask to retain the silicon nitride film 15a on the gate insulating film.

Figure 22C:
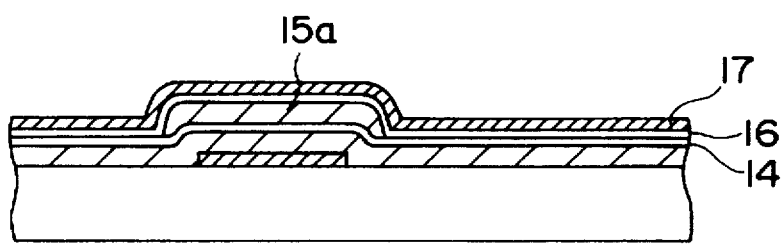

Next, as shown in FIG. 22C, an n+ type a-Si film 16 and a metal film 17 are formed in order on the silicon nitride film 15a and the a-Si film 14 appeared from the silicon nitride film 15a. A substrate 101a includes a set of the glass substrate 11 and the other elements 12, 13, 14, 15a, 16 thereon, or a set of the glass substrate 11 and the other elements 12, 13, 14, 15a, 16, 17 thereon.

Figure 22D:
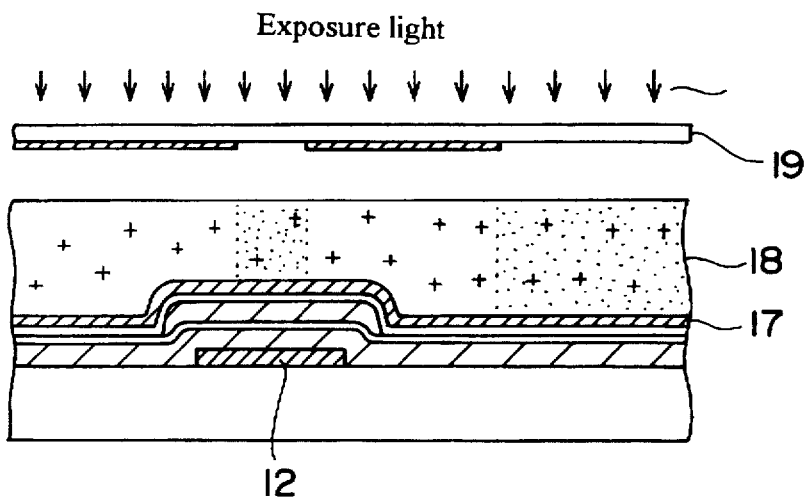
Figure 22E:
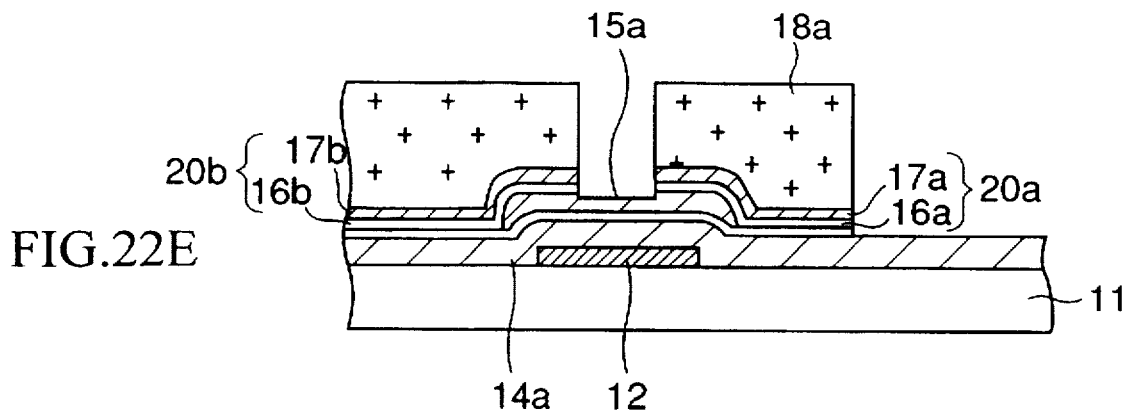
Figure 22F:
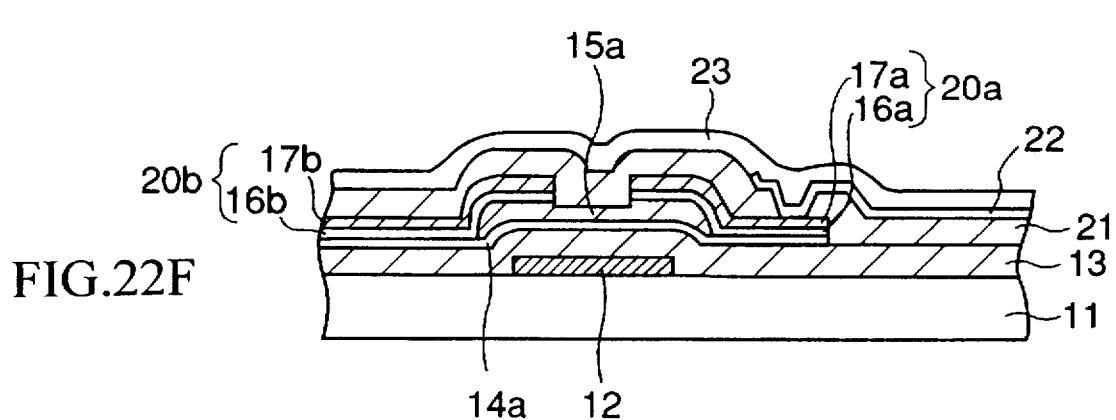

Then, as shown in FIG. 22D, a resist film 18 is formed, then a resultant structure is exposed using the reticle 19 of the third layer like the case in FIG. 22A and developed, so that, as shown in FIG. 22E, a resist mask 18a is formed in a region to form source and drain electrodes. At this time, with taking account of alignment precision, the region to form source and drain electrodes is formed large rather than the size of the contact holes on both sides of the silicon nitride film 15a to extend to the area over the gate electrode 12. As a result, source and drain electrodes to be formed are overlapped with both end portions of the gate electrode 12.

Subsequently, as shown in FIG. 22E, the metal film 17, the n+ type a-Si film 16, and the a-Si film 14 are etched in sequence in compliance with the resist mask 18a. Thereby, the channel layer 14a formed of the a-Si film and the source electrode 20a and the drain electrode 20b, both contacting the channel layer 14a, are formed. Here the source electrode 20a is formed of two layers consisting of a metal film 17a and an n+ type a-Si film 16a, and the drain electrode 20b is formed of two layers consisting of a metal film 17b and an n+ type a-Si film 16b.

Succeedingly, as shown in FIG. 22F, when the silicon nitride film 21 is formed to cover the surface, then the TFT matrix device is completed.

If the TFT matrix type liquid crystal display device is to be formed, then openings are formed in the silicon nitride film 21 formed on the source electrode 20a. An ITO film is formed subsequently, then like the case in FIG. 22A a resist mask is formed by the photolithography technique using the reticle of the fourth layer. Then, the ITO film is etched by the dry etching technique using the resist mask to thus form a pixel electrode 22. Further, an alignment film 23 is formed on the pixel electrode 22.

As shown in FIG. 23, a transparent common electrode 25 and an alignment film 26 are formed on another glass substrate 24. In addition, a clearance is formed between the glass substrate 24 and the glass substrate 11 by superimposing them, then a liquid crystal 27 is injected into the clearance. A color filter 28 may be interposed between the common electrode 25 and the alignment film 26 as the case may be.

Furthermore, when polarization plates 29, 30 are provided on the back surfaces of the glass substrates 11, 24, then the TFT matrix type liquid crystal display device is finished.

Figure 24A:
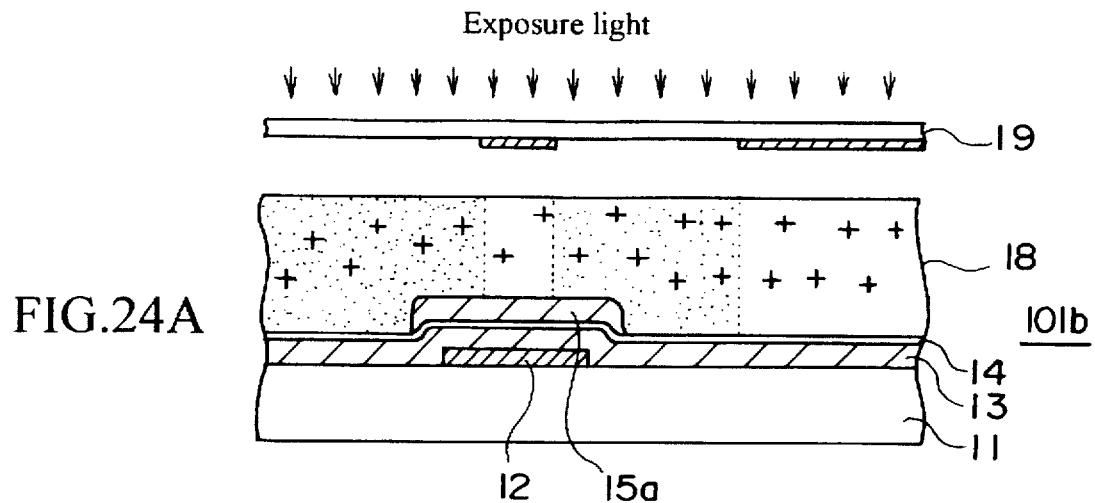
FIGS. 24A and 24B are sectional views showing another method of manufacturing the TFT matrix device according to embodiments of the present invention.
Figure 24B:
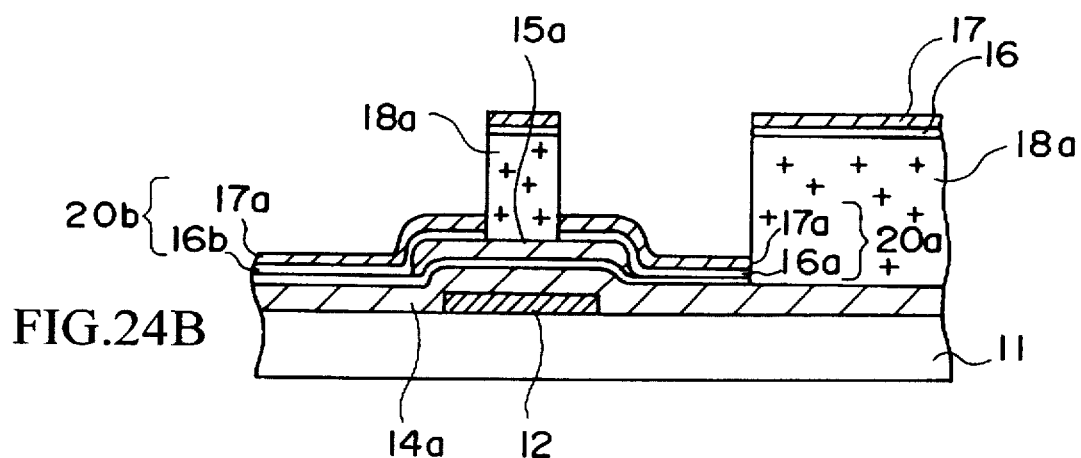

Moreover, it is capable of forming source and drain electrodes using a lift-off method as shown in FIG. 24A and FIG. 24B in place of the etching method as shown in FIG. 22C to FIG. 22E.

That is, after the step in FIG. 22B, as shown in FIG. 24A, a resist film 18 is formed. Subsequently, the resist film 18 is exposed using a reticle 19 for the third layer and then developed to form a resist mask 18a having openings in regions for forming source and drain electrodes.

After that, as shown in FIG. 24B, the n+ type a-Si film 16 and the metal film 17 are deposited in order on the resist mask 18a and in the openings. The resist mask 18a is removed, whereby, by way of a lift-off that the n+ type a-Si film 16 and the metal film 17 on the resist film 18a are removed with the resist mask 18a, the source electrode 20a and the drain electrode 20b, both contacting the a-Si film 14, are formed. Here the source electrode 20a is formed of two layers consisting of a metal film 17a and an n+ type a-Si film 16a, and the drain electrode 20b is formed of two layers consisting of the metal film 17b and the n+ type a-Si film 16b.

Afterward, the a-Si film 14 appeared out of the metal film 17b and the n+ type a-Si film 16b is removed to form a channel layer 14a.

The step of FIG. 24B is followed by the step of FIG. 22F.

With the above discussion, in the reticles shown in FIGS. 7, 9 and 10, the light-shielding regions SR1a, SR1b, SR2a, SR2b, SR3a to SR3d and the pattern forming regions PFR1a, PFR1b, PFR2a, PFR2b, PFR3a to PFR3d are aligned alternatively at boundary portions BR1a, BR1b, BR2a, BR2b, BR3a to BR3d between two or four reticles in either the vertical direction or the lateral direction to interpolate with each other. Accordingly, if the boundary portions are transferred superimposedly to joint respective pattern forming regions, then the boundary line between different pattern forming regions is formed as a zigzagged line in the entire jointed pattern.

In other words, if the entire pattern of the TFT matrix device according to embodiments of the present invention is formed by jointing patterns using these reticles, then the boundary line between the pattern forming regions becomes complicated irregularly, as shown in FIG. 6, and not formed on a straight line.

Figure 1:
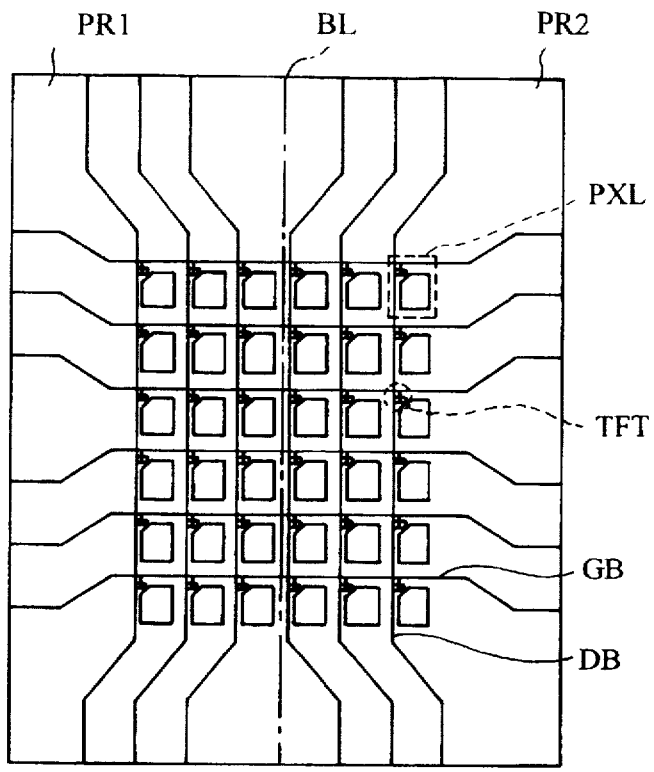
FIG. 1 is a plan view showing a TFT matrix device and a liquid crystal display device according to a conventional example.
Figure 2:
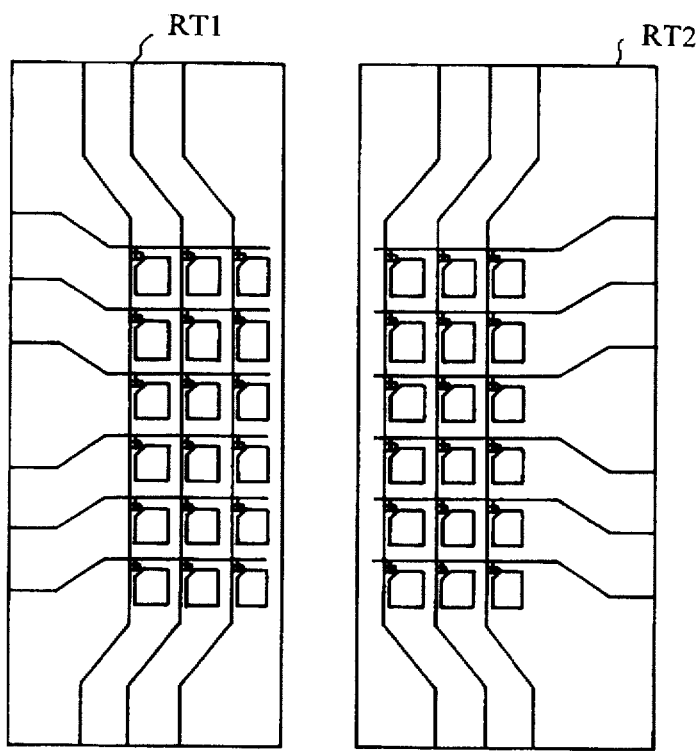
FIG. 2 is a plan view showing a reticle according to the conventional example.
Figure 3A:
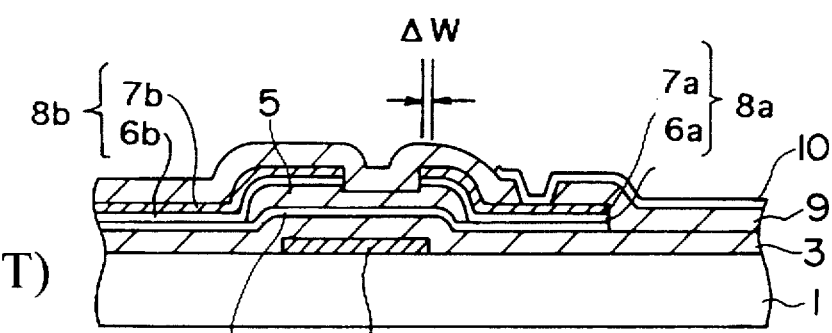
FIGS. 3A and 3B are sectional views showing a method of manufacturing an ordinary TFT matrix device and a liquid crystal display device.
Figure 3B:
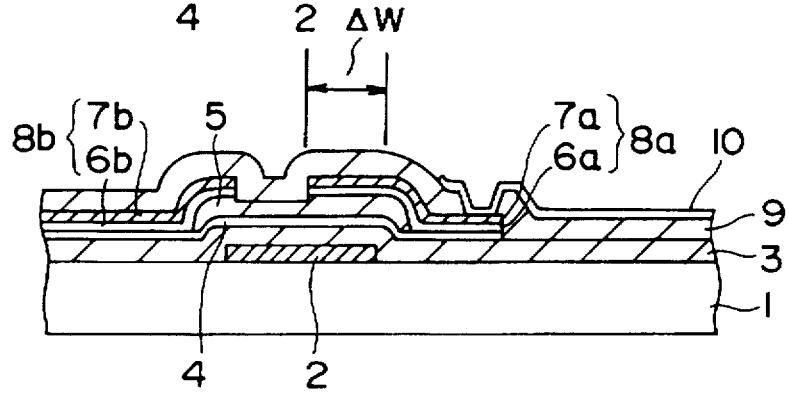
Figure 4A:
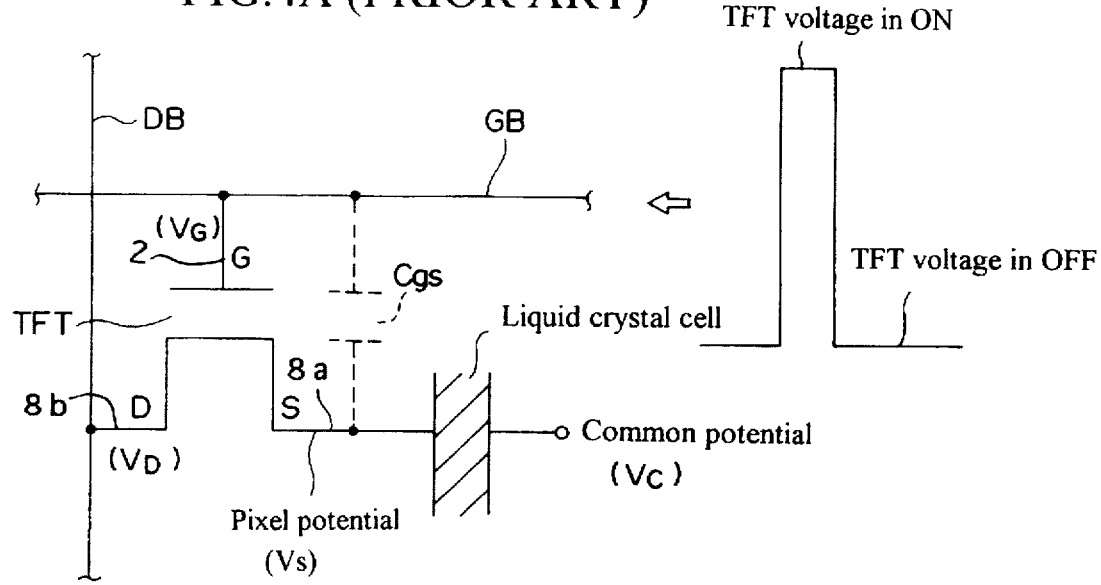
FIG. 4A shows an equivalent circuit diagram of a liquid crystal display device having a TFT matrix for explaining problems in the conventional example.
Figure 4B:
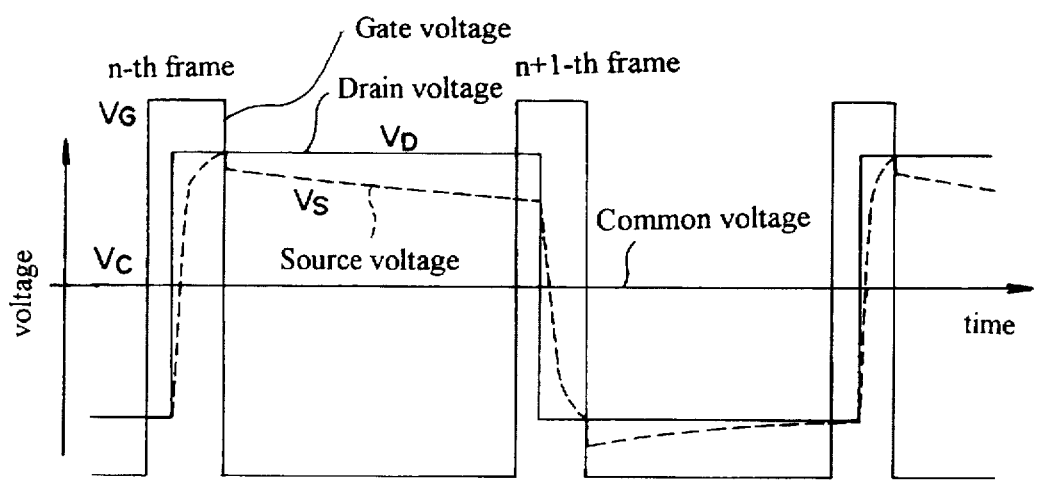
FIG. 4B is a timing chart showing operation of the liquid crystal display device.
Figure 5:
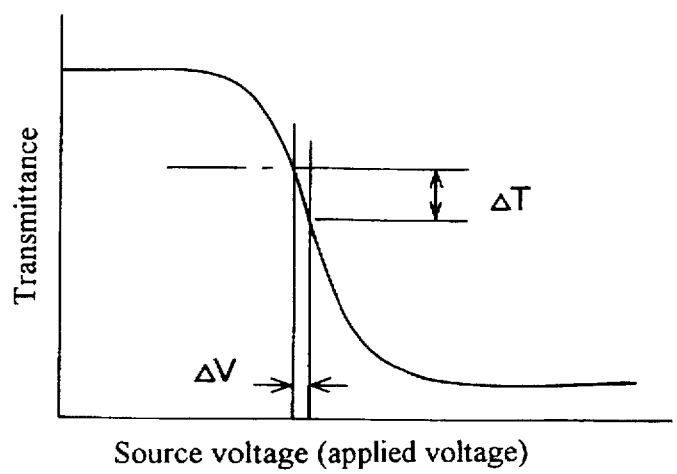
FIG. 5 is a characteristic view showing relationship between source voltage (applied voltage) and transmittance of a liquid crystal for explaining problems in the conventional example.

Accordingly, when the TFT matrix device is applied to the TFT matrix type liquid crystal display device according to the embodiments of the present invention, portions having difference in brightness due to Cgs difference are not aligned on a straight line at the boundary portion between the pattern forming regions even if different Cgs are generated in the pattern forming regions because of deviation in alignment upon transferring the pattern forming regions, as shown in FIGS. 3A and 3B. For this reason, disuniformity on the display screen of the liquid crystal device cannot be perceived visually by the human eyes. As a result, disuniformity on the screen of the liquid crystal display device can be prevented.

Especially, if size of the light-shielding regions on the reticles, or size of at least one of projected portions and recess portions at the boundary line between the pattern forming regions on the TFT matrix device is less than the pattern resolution which can be perceived visually by the human eyes, then display disuniformity cannot be perceived more effectively by the human eyes.

That is, as shown in FIG. 6, for example, since the boundary line between the pattern forming regions PFR1a, PFR1b belonging to different reticles RT11a, RT11b is zigzagged, the pattern forming region PFR1b of other reticle RT11b is inserted into the pattern forming region PFR1a of the reticle RT11a, as shown in FIG. 6. In this event, since a size of at least one of the pattern forming regions PFR1a, PFR1b is set less than the pattern resolution perceived visually by the human eyes, the boundary between different pattern forming regions PFR1a, PFR1b becomes vague visually to the human eyes. For this reason, in the event that a synthesized pattern is applied to the TFT matrix device in the liquid crystal display device, the clear boundary line between different pattern forming regions PFR1a, PFR1b cannot be perceived even if difference in brightness occurs between them.

(2) Fourth Embodiment

Figure 11:
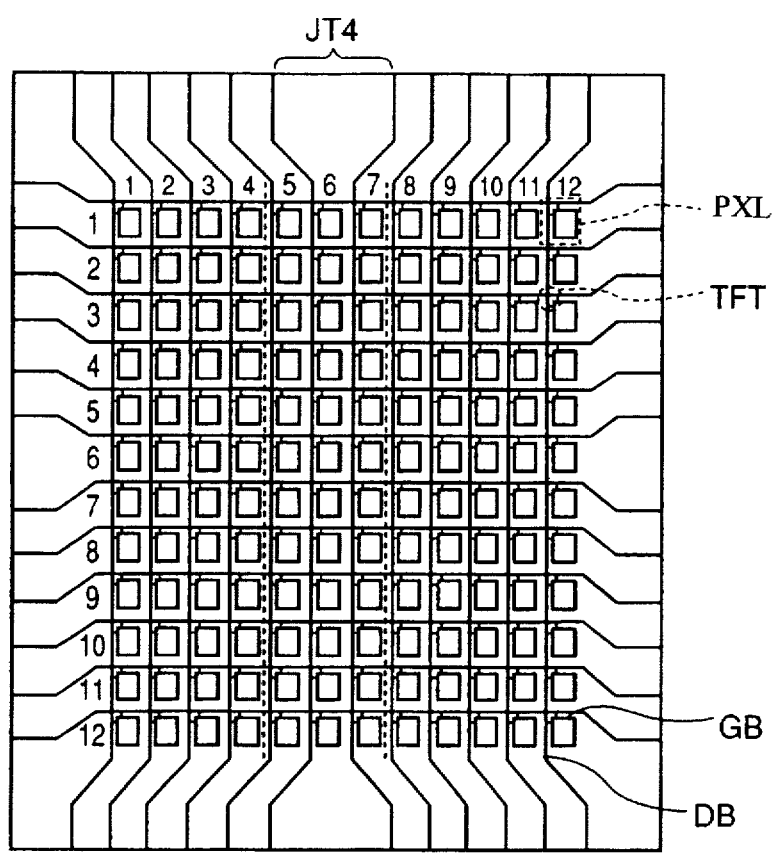
FIG. 11 is a plan view showing a TFT matrix device and a part of a liquid crystal display device applying it according to a fourth embodiment of the present invention.
Figure 12:
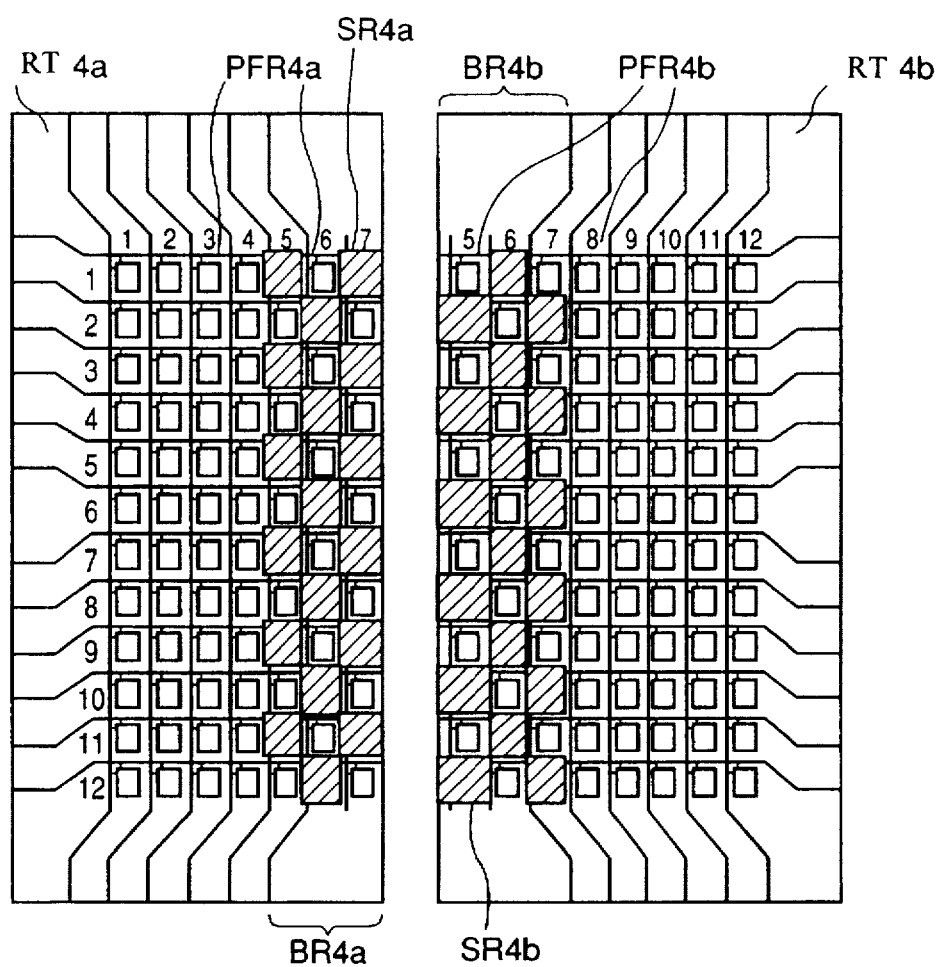
FIG. 12 is a plan view showing a reticle according to the fourth embodiment of the present invention.

FIG. 11 is a plan view showing a TFT matrix device according to a fourth embodiment of the present invention. FIG. 12 is a plan view showing a set of two reticles (exposure masks) RT4a, RT4b which are formed by splitting the overall TFT matrix pattern in FIG. 11 into right and left portions to assign pattern forming regions PFR4a, PFR4b.

There is shown a set of reticles RT4a, RT4b of any layer out of reticles of plural layers which forms overall the TFT matrix pattern in FIG. 11. The patterns on the reticles RT4a, RT4b are not actual patterns, but show overlapped patterns under the assumption that they are the patterns of plural layers that are superimposed to coincide with those in FIG. 11, for the sake of simplicity of explanation.

The number of pixels including one TFT are simplified for illustration in FIGS. 11 and 12, and pixels are arranged in a 12 column×12 row matrix fashion. Dimensions of one pixel are determined according to the overall size of the display area and total number of pixels, being required, and patterning precision. In this embodiment, size of one pixel is 100 μm×100 μm. Dimensions of one pixel may be reduced still more as the case may be.

The fourth embodiment is different from the first to third embodiment in that, as shown in FIG. 12, three pixel patterns are used as boundary portions BR4a, BR4b of the reticles RT4a, RT4b and that light-shielding regions SR4a, SR4b and pattern forming regions PFR4a, PFR4b are aligned alternatively in the vertical and lateral directions. In other words, an arrangement like light-shielding region-pattern forming region-light-shielding region, or pattern forming region-light-shielding region-pattern forming region is utilized in the lateral direction, while an arrangement like light-shielding region-pattern forming region-light-shielding region-pattern forming region, ..., or pattern forming region-light-shielding region-pattern forming region light-shielding region, ... is utilized in the vertical direction. Sizes of the light-shielding region and pattern forming region PFR4a, PFR4b correspond to a size of one pixel pattern.

In order to form an overall pattern, if the boundary portions BR4b on the reticle RT4b are superimposed on the boundary portions BR4a on the reticle RT4a transferred previously on the resist film, then the pattern forming regions PFR4b of the reticle RT4b are transferred as latent images to the unexposed region corresponding to the light-shielding regions SR4a of the reticle RT4a and simultaneously the latent images of the pattern forming regions PFR4a of the reticle RT4a are covered with the light-shielding regions SR4b of the reticle RT4b. Therefore, the pattern forming regions PFR4a, transferred previously other than the boundary portions BR4a are covered, then exposed to transfer the pattern forming regions PFR4b of the reticle RT4b as latent images on the resist film, and then developed. As a result, an overall pattern of one layer in which pixel patterns are arranged sequentially in the vertical and lateral directions can be achieved. Superimposed portions of the boundary portions BR4a of the reticle RT4a and the boundary portions BR4b of the reticle RT4b are called jointed portions JT4.

After this, if patterning is executed with respect to all the layers like the above, then the overall TFT matrix pattern shown in FIG. 11 can be obtained.

In the TFT matrix pattern formed as stated above, different pattern forming regions PFR4a, PFR4b are arranged alternatively and mixedly in the vertical and lateral directions on the jointed portions JT4.

Accordingly, in the event that the above TFT matrix device is applied to the TFT matrix type liquid crystal display device according to the embodiment of the present invention, even when deviation in alignment occurs upon transferring respective pattern forming regions PFR4a, PFR4b, intermediate brightness between brightness differences appears on the jointed portion JT4 since regions having different brightness due to difference in the floating capacitance Cgs are mixedly arranged, so that the display looks like such that brightness changes gradually from one brightness to another brightness. For this reason, nonuniformity of the display cannot be observed on the screen of the liquid crystal display device by the human eyes and, as a result, nonuniformity of the display of the liquid crystal display device can be suppressed.

Particularly, if size of respective light-shielding regions SR4a, SR4b on the reticles RT4a, RT4b, or size of at least one of the pattern forming regions PFR4a, PFR4b belonging to different reticles RT4a, RT4b in the jointed portions JT4 on the TFT matrix device is less than the pattern resolution which can be perceived visually by the human eyes, then display disuniformity cannot be perceived more effectively by the human eyes.

Namely, as shown in FIG. 11, in case the pattern forming regions PFR4a on the reticle RT4a and the pattern forming regions PFR4b on the reticle RT4b are mixed in the jointed portions JT4, the boundary between the pattern forming regions PFR4a, PFR4b becomes vague visually to the human eyes since the size of at least one of the pattern forming regions PFR4a, PFR4b becomes less than the pattern resolution perceived visually by the human eyes. For this reason, in the event that an overall jointed TFT matrix pattern is applied to the TFT matrix device in the liquid crystal display device, the clear boundary line between different pattern forming regions PFR4a, PFR4b cannot be perceived even if difference in brightness occurs between them.

(3) Fifth Embodiment

Figure 13:
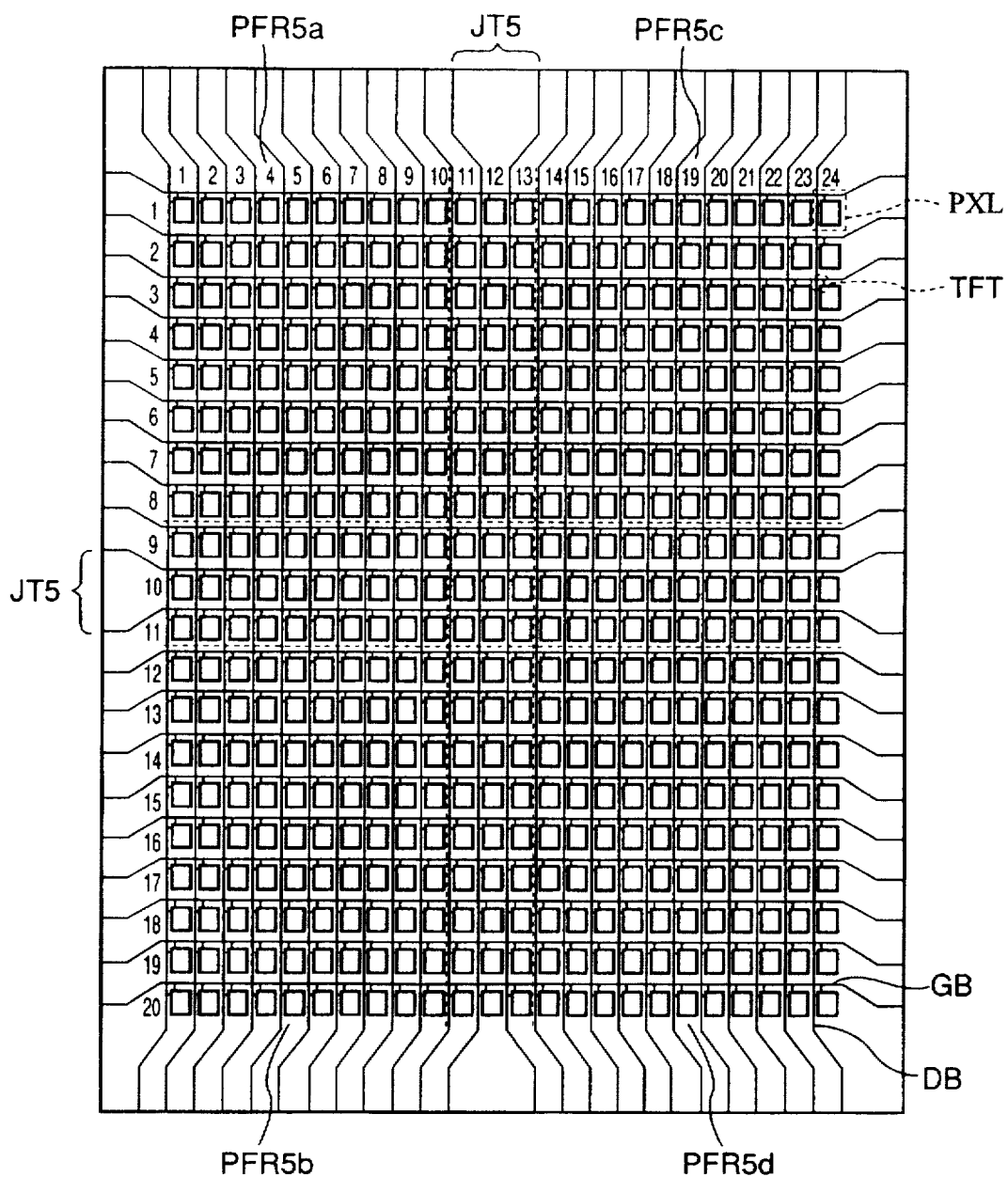
FIG. 13 is a plan view showing a TFT matrix device and a part of a liquid crystal display device applying it according to a fifth embodiment of the present invention.
Figure 14:
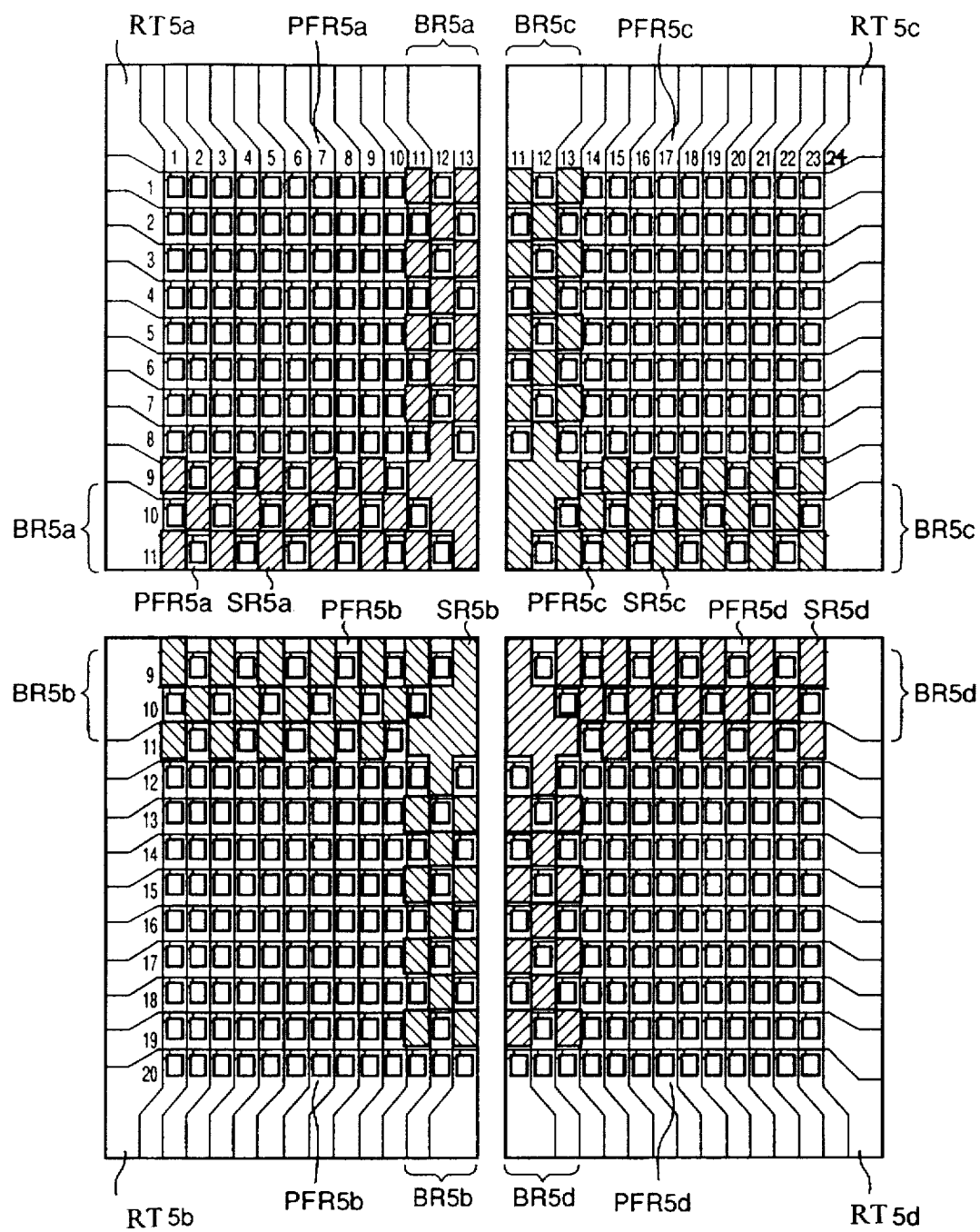
FIG. 14 is a plan view showing a reticle according to the fifth embodiment of the present invention.

FIG. 13 is a plan view showing a TFT matrix device according to a fifth embodiment of the present invention. FIG. 14 is a plan view showing four reticles RT5a to RT5d which are formed by splitting an entire TFT matrix pattern in FIG. 13 into four portions.

The entire TFT matrix pattern is split into upper left, lower left, upper right, and lower right pattern forming regions PFR5a to PFR5b. These reticles RT5a to RT5b show a set of reticles on any layer out of plural layers to form the entire TFT matrix pattern in FIG. 13. The patterns on the reticles RT5a to RT5d are not actual patterns, but show overlapped patterns under the assumption that they are the patterns of plural layers that are superimposed to coincide with those in FIG. 13, for the sake of simplicity of explanation.

The number of pixels including one TFT are simplified for illustration in FIGS. 13 and 14, and pixels are arranged in a 20 column×24 row matrix fashion. In this embodiment, size of one pixel is substantially 50 μm×50 μm in the vertical and lateral directions.

In this event, like the fourth embodiment, three pixel patterns from the boundary edges of the reticles RT5a to RT5d are formed as boundary portions BR5a to BR5d between the reticles RT5a to RT5d. Light-shielding regions SR5a to SR5d and pattern forming regions PFR5a to PFR5d are arranged on the boundary portions BR5a to BR5d alternatively in the vertical and lateral directions. However, in the case of the fifth embodiment, in the central area wherein four reticles RT5a to RT5d are overlapped, any of the pattern forming regions PFR5a to PFR5d is formed on one of four reticles RT5a to RT5d while any of the light-shielding regions SR5a to SR5d is formed on remaining reticles. Therefore, regularity of arrangement of the pattern forming regions and the light-shielding regions is lost.

Sizes of the light-shielding regions SR5a to SR5d and the pattern forming regions PFR5a to PFR5d on the boundary portions BR5a to BR5b correspond to that of one pixel pattern respectively.

In the case that the entire TFT matrix pattern is formed with the use of the reticles RT5a to RT5d, the reticles RT5a to RT5d are exposed one by one.

For instance, while other reticles RT5b to RT5d are being light-shielded, the resist film is exposed via the reticle RT5a to transfer the pattern forming regions PFR5a on the resist film. The reticle RT5a has two boundary portions BR5a in its right and lower areas.

In turn, the upper boundary portion BR5b of two upper and right boundary portions BR5b of the reticle RT5b is positioned to be overlapped with the lower boundary portion BR5a of the reticle RT5a previously transferred. At this time, the pattern forming region PFR5b of the reticle RT5b is overlapped with the unexposed regions corresponding to the light-shielding region SR5a of the reticle RT5a, and simultaneously the light-shielding region SR5b of the reticle RT5b is overlapped with the pattern forming regions PFR5a of the reticle RT5a. Subsequently, if the resist film is exposed via the reticle RT5b to transfer the pattern forming regions PFR5b as latent images on the resist film with other regions being light-shielded, then the pattern forming regions PFR5a, PFR5b are jointed so that pixel patterns are arranged continuously.

Subsequently, the left boundary portion BR5c of two lower and left boundary portions BR5c of the reticle RT5c is positioned to be overlapped with the right boundary portion BR5a of the reticle RT5a previously transferred. In this event, the pattern forming region PFR5c of the reticle RT5c is overlapped with the unexposed regions corresponding to the light-shielding region SR5a of the reticle RT5a, and at the same time the light-shielding region SR5c of the reticle RT5c is overlapped with the pattern forming region PFR5a of the reticle RT5a. Subsequently, if the resist film is exposed via the reticle RT5c to transfer the pattern forming regions PFR5c on the resist film with other regions being light-shielded, then the pattern forming regions PFR5a, PFR5b, and PFR5c are jointed so that pixel patterns are arranged continuously.

Finally, the upper boundary portion BR5d of two upper and left boundary portions BR5d of the reticle RT5d is placed to be overlapped with the lower boundary portion BR5c of the reticle RT5c previously transferred, and also the left boundary portion BR5d of the reticle RT5d is placed to be overlapped with the right boundary portion BR5b of the reticle RT5b previously transferred. At this time, the pattern forming region PFR5d of the reticle RT5d is overlapped with the light-shielding regions SR5c, SR5b of the reticles RT5c, RT5b and at the same time the light-shielding region SR5d of the reticle RT5d is overlapped with the pattern forming regions PFR5c, PFR5b of the reticles RT5c, RT5b. If the resist film is exposed via the reticle RT5d to transfer the pattern forming regions PFR5d on the resist film while other regions are being light-shielded, then all the pattern forming regions PFR5a, PFR5b, PFR5c, and PFR5d are jointed. As a result, respective patterns are arranged continuously in the vertical and lateral directions to achieve an all over pattern of one layer.

Thereafter, if all the layers are patterned in the similar way as described above, a complete TFT matrix pattern can be formed, as shown in FIG. 13.

With the above, according to the fifth embodiment, in the TFT matrix pattern, different pattern forming regions PFR5a to PFR5d are arranged alternatively in the vertical and lateral directions on the boundary portions BR5a to BR5d between the reticles.

Therefore, in the event that the above TFT matrix device is applied to the TFT matrix type liquid crystal display device according to the embodiment of the present invention, even when deviation in alignment occurs upon transferring respective pattern forming regions PFR5a, PFR5b, PFR5c, and PFR5d, intermediate brightness between brightness differences appears on the jointed portion JT5 since regions having different brightness due to difference in the floating capacitance Cgs are mixedly arranged. For this reason, disuniformity of the display cannot be observed on the screen of the liquid crystal display device by the human eyes.

In particular, if the size of the respective light-shielding regions SR5a to SR5d on the reticles RT5a to RT5d, or the size of at least one of the pattern forming regions PFR5a to PFR5d belonging to different reticles RT5a to 5d in the jointed portions JT5 on the TFT matrix device is less than the pattern resolution which can be perceived visually by the human eyes, then display disuniformity cannot be perceived more effectively by the human eyes, like the first to fourth embodiments.

(4) Sixth Embodiment

Figure 15:
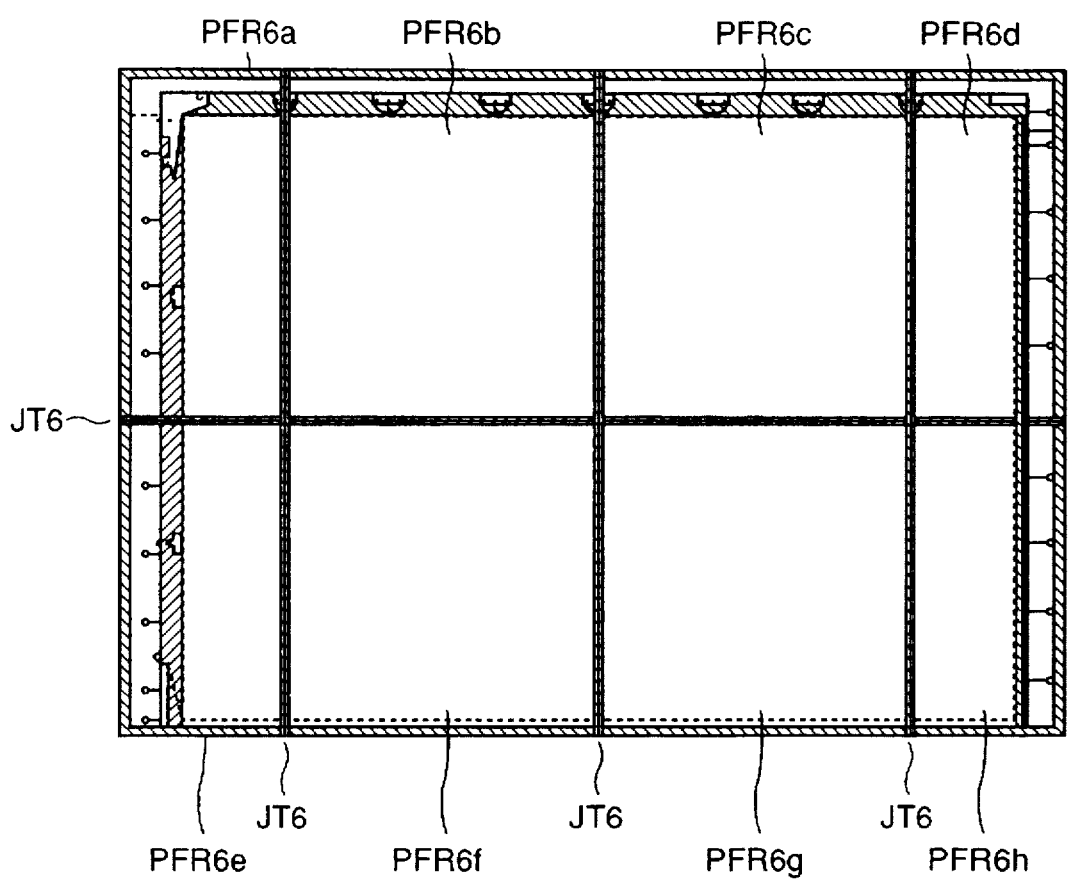
FIG. 15 is a plan view showing a TFT matrix device and a part of a liquid crystal display device applying it according to a sixth embodiment of the present invention.

FIG. 15 is a plan view showing a TFT matrix device according to a sixth embodiment of the present invention. An entire TFT matrix pattern is split into eight partial regions.

In other words, four pattern forming regions PFR6a, PFR6b, PFR6c, and PFR6d are jointed sequentially in the right direction, and four pattern forming regions PFR6e, PFR6f, PFR6g, and PFR6h are jointed on a one-by-one basis in the vertical direction along their four lateral directions and also they are jointed mutually in the lateral direction.

In this event, foregoing arrangements in the first to the fifth embodiments may also be applied to arrangement of the pattern forming regions and the light-shielding regions on the boundary portions of the reticles.

There are three boundary portions between the pattern forming regions PFR6b, PFR6c, PFR6f, and PFR6g in the central area. Therefore, combinations of them are (PFR6a, PFR6b, PFR6e, PFR6f), (PFR6b, PFR6c, PFR6f, PFR6g), and (PFR6c, PFR6d, PFR6g, PFR6h). Like the case in FIG. 14, alternate arrangements of the pattern forming regions and the light-shielding regions are lost on their joint portions.

15

According to the finished TFT matrix pattern above, like the first to fifth embodiments, since regions having difference in brightness due to difference in Cgs are not aligned on a straight line or are aligned mixedly on the joint portions JT6, display disuniformity on the screen of the liquid crystal device cannot be perceived visually by the human eyes.

In practical use, since the pattern forming regions PFR6*a*, PFR6*d*, and PFR6*e*, and PFR6*h* on both sides are narrowed, it is preferable that two pattern forming regions, e.g., regions PFR6*a*, PFR6*d*, and PFR6*e*, PFR6*h* are formed on one reticle. In this case, in the event that respective pattern forming regions PFR6*a* or PFR6*d*, and PFR6*e* or PFR6*h* are transferred, the pattern forming regions PFR6*d* or PFR6*a*, and PFR6*h* or PFR6*e* not to be transferred are light-shielded.

(5) Seventh Embodiment

Figure 16:
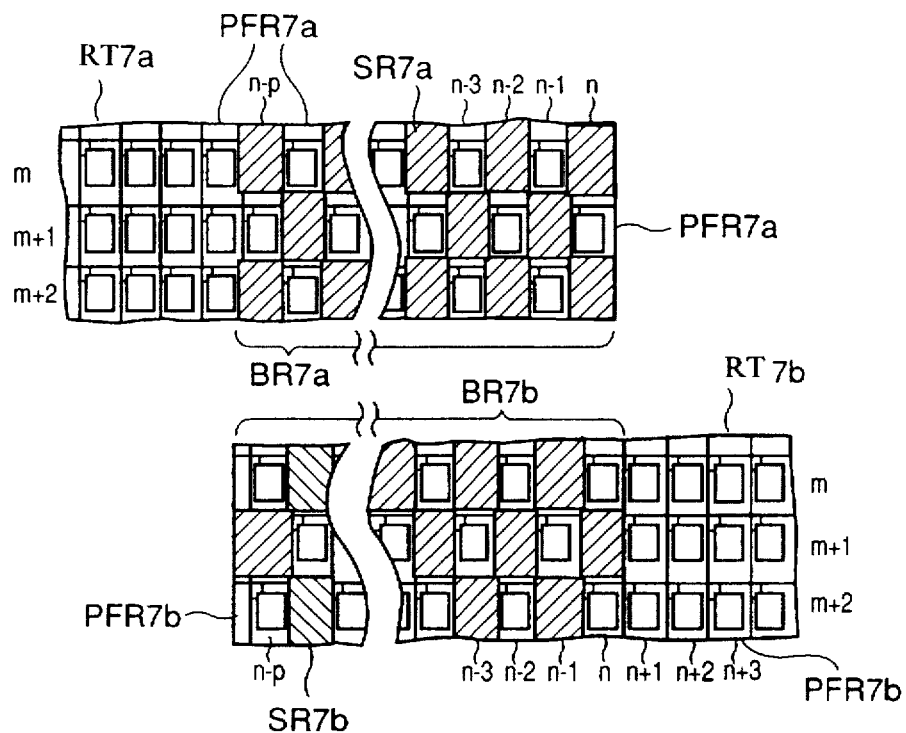
FIG. 16 is a plan view showing a reticle according to a seventh embodiment of the present invention.

FIG. 16 is a plan view showing a set of reticles RT7*a*, RT7*b* on any layer out of two reticle sets formed on every layer, which are obtained by splitting the entire TFT matrix pattern into two right and left partial regions. In this case, the patterns on the reticles RT7*a*, RT7*b* are not actual patterns, but show overlapped patterns under the assumption that they are the patterns of plural layers that are superimposed, for the sake of simplicity of explanation. The above discussion is similarly true of the following eighth to tenth embodiments.

Three rows from the m-th row to the m+2-th row on the reticles RT7*a*, RT7*b* are extracted. Rows from the n-p-th column to the n-th column in the entire TFT matrix pattern are formed as joint portions, which correspond to the boundary portions BR7*a*, BR7*b* on the reticles RT7*a*, RT7*b*. Where p denotes the number more than 2.

Like the fourth embodiment, the light-shielding regions SR7*a*, SR7*b* and the pattern forming regions PFR7*a*, PFR7*b*, each corresponding to one pixel pattern size, are aligned alternatively in the vertical and lateral directions on the boundary portions BR7*a*, BR7*b*. However, unlike the fourth embodiment, two, four or more pixel patterns act as the boundary portions BR7*a*, BR7*b*.

In this fashion, size of the boundary region may be set arbitrarily under the restriction that it can be formed as one reticle. The number of pixel patterns included in the boundary regions may also be selected arbitrarily under the above restriction.

(6) Eighth Embodiment

Figure 17:
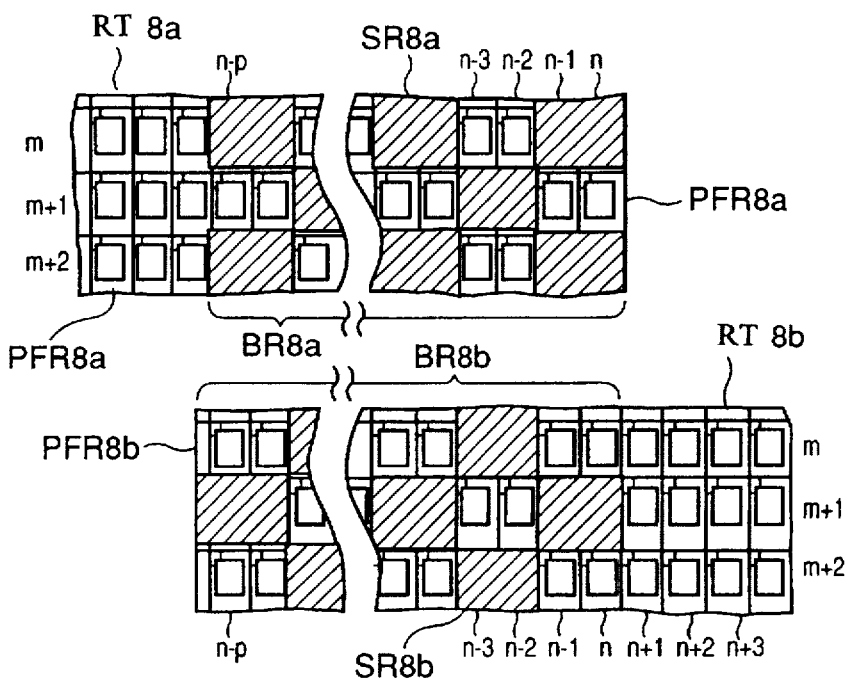
FIG. 17 is a plan view showing a reticle according to an eighth embodiment of the present invention.

FIG. 17 is a plan view showing two reticles RT8*a*, RT8*b* formed by splitting a whole TFT matrix pattern of one layer into two right and left partial regions.

Three rows from the m-th row to the m+2-th row on the reticles RT8*a*, RT8*b* are extracted. Rows from the n-p-th column to the n-th column in the entire TFT matrix pattern are formed as joint portions, which correspond to the boundary portions BR8*a*, BR8*b* on the reticles RT8*a*, RT8*b*. Where p denotes the number more than 4.

As in the fourth embodiment, the light-shielding regions SR8*a*, SR8b and the pattern forming regions PFR8*a*, PFR8*b* are aligned alternatively in the vertical and lateral directions and sizes of the boundary portions BR8*a*, BR8*b* may be selected arbitrarily. However, unlike the fourth embodiment, the light-shielding regions SR8*a*, SR8*b* and the pattern forming regions PFR8*a*, PFR8*b*, which are being formed continuously, correspond to two pixel patterns in size.

In this manner, sizes of the light-shielding regions SR8*a*, SR8*b* and the pattern forming regions PFR8*a*, PFR8*b*, which are being formed continuously, may be selected arbitrarily.

16

(7) Ninth Embodiment

Figure 18:
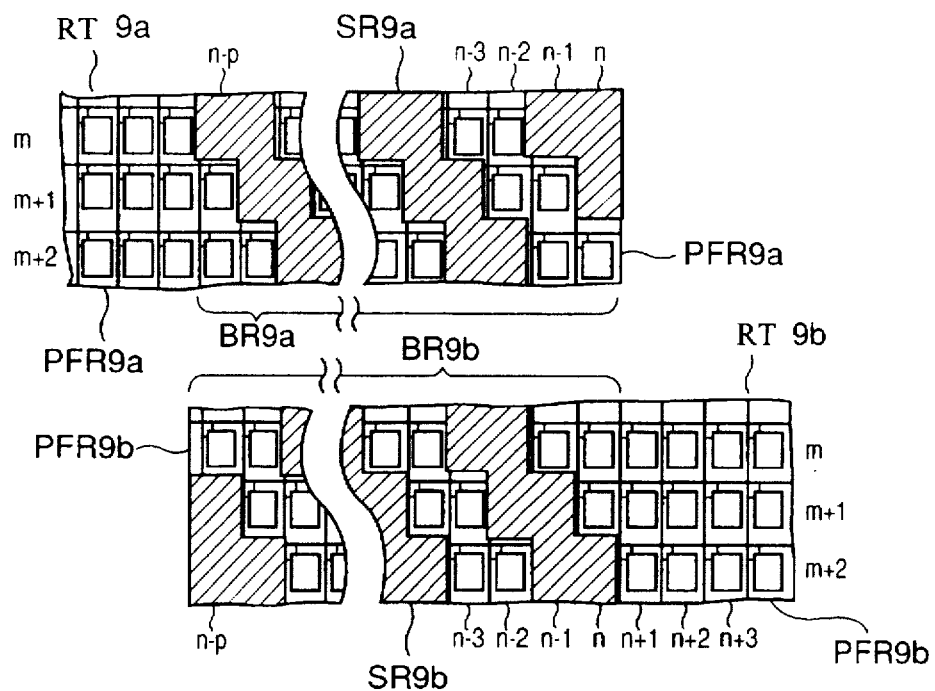
FIG. 18 is a plan view showing a reticle according to a ninth embodiment of the present invention.

FIG. 18 is a plan view showing two reticles RT9*a*, RT9*b* formed by splitting a whole TFT matrix pattern of one layer into two right and left partial regions.

Three rows from the m-th row to the m+2-th row on the reticles RT9*a*, RT9*b* are extracted. Rows from the n-p-th column to the n-th column in the entire TFT matrix pattern are formed as joint portions, which correspond to the boundary portions BR9*a*, BR9*b* on respective reticles RT9*a*, RT9*b*.

In the ninth embodiment, as shown in FIG. 17, like the eighth embodiment, the light-shielding regions SR9*a*, SR9*b* and the pattern forming regions PFR9*a*, PFR9*b* correspond respectively to two pixel patterns in size, and the light-shielding regions SR9*a*, SR9*b* and the pattern forming regions PFR9*a*, PFR9*b* are aligned alternatively in the vertical and lateral directions. However, in contrast to the arrangement in the eighth embodiment, an upper arrangement is shifted in the right direction by one pixel pattern as a whole while a lower arrangement is shifted in the left direction by one pixel pattern as a whole. In other words, as shown in FIG. 18, the light-shielding regions SR9*a*, SR9*b* and the pattern forming regions PFR9*a*, PFR9*b* are aligned continuously in the oblique direction.

(8) Tenth Embodiment

Figure 19:
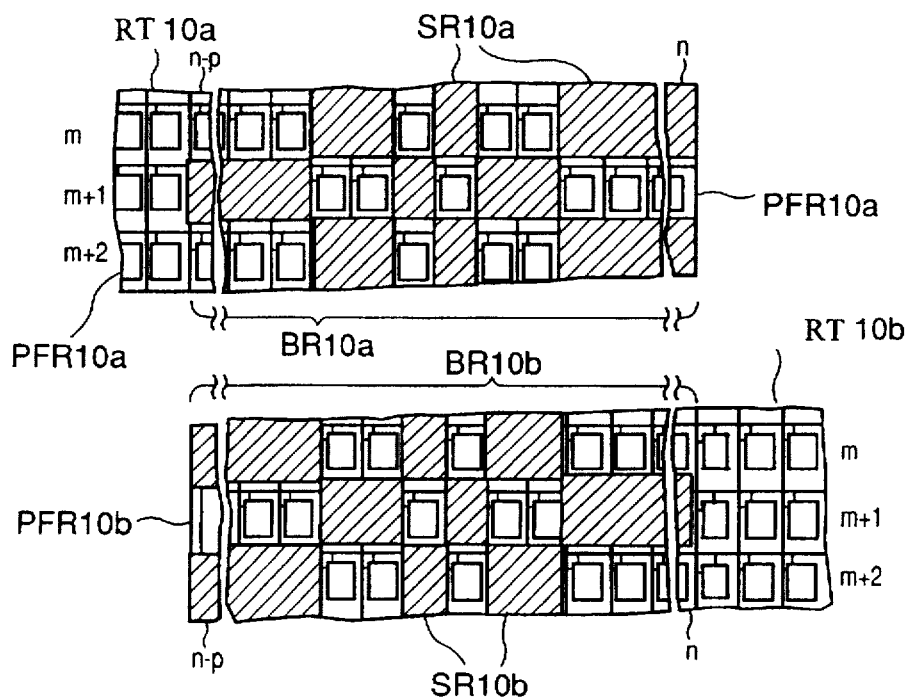
FIG. 19 is a plan view showing a reticle according to a tenth embodiment of the present invention.

FIG. 19 is a plan view showing two reticles RT10*a*, RT10*b* formed by splitting a whole TFT matrix pattern of one layer into two right and left partial regions.

Three rows from the m-th row to the m+2-th row on the reticles RT10*a*, RT10*b* are extracted. Rows from the n-p-th column to the n-th column in the entire TFT matrix pattern are formed as the boundary portions BR10*a*, BR10*b* on the reticles RT10*a*, RT10*b*. When patterns are transferred by overlapping the boundary portions BR10*a*, BR10*b*, overlapped portions serve as joint portions.

Like the above embodiments, the light-shielding regions SR10*a*, SR10*b* and the pattern forming regions PFR10*a*, PFR10*b* are aligned alternatively in the vertical and lateral directions. However, unlike the above embodiments, sizes of the light-shielding regions SR10*a*, SR10*b* and the boundary portions BR10*a*, BR 10*b* are varied in one row. In the case of the tenth embodiment, sizes of the light-shielding regions SR10*a*, SR10*b* and the pattern forming regions PFR10*a*, PFR10*b* on the boundary portions BR10*a*, BR 10*b* are gradually reduced from the size of pixel pattern p/2 on the boundary edges between the reticles RT10*a*, RT10*b*, and then increased in the middle up to the pixel pattern p/2 on the n-th column.

By arranging joint portions to have such arrangement, brightness on the screen is changed apparently continuously even if deviation of patterns occurs, so that more natural display can be achieved.

As discussed above, according to the seventh to tenth embodiments, in the joint portion formed by superimposing the boundary portions of the reticles, different pattern forming regions are mixedly arranged, so that the boundary areas between different pattern forming regions become unclear. Therefore, if difference in brightness because of difference in Cgs occurs between different pattern forming regions, display disuniformity on the screen of the liquid crystal display device cannot be perceived visually by the human eyes since the boundary portions between the pattern forming regions having difference in brightness become unclear.

In particular, in the case of the seventh to tenth embodiments, it is desired that sizes of at least one of the light-shielding regions and the pattern forming regions on the boundary portions are set less than pattern resolution by the human eyes, e.g., less than 200 μm.

As discussed above, in the present invention, the unexposed regions on a photosensitive film are beforehand formed using an exposure mask in regions where first patterns are to be arranged, afterward latent images of the first patterns are formed therein using another exposure mask, and subsequently the photosensitive film is developed to form patterns.

Thereby, in pattern joint portion, the boundary line between patterns according to different exposure masks may be zigzagged and the patterns according to different exposure masks may be arranged mixedly without loss of regularity.

Accordingly, in the event that the TFT matrix device formed using the above method is applied to the liquid crystal display device, even when alignment is shifted upon transferring the pattern forming regions so that Cgs becomes different in respective pattern forming regions, portions with difference in brightness because of difference in Cgs are not arranged on a straight line on the boundary between the pattern forming regions, or the boundary portions become vague. As a result, display disuniformity cannot be perceived visually by the human eyes, so that as a result display disuniformity on the screen of the liquid crystal display device can be suppressed.

Particularly, in the jointed portions in the TFT matrix device, if size of different pattern forming regions is set less than the pattern resolution which can be perceived visually by the human eyes, then display disuniformity cannot be perceived more effectively by the human eyes.

What is claimed is:

1. A method of forming a pattern comprising the steps of:
   (1) forming a photosensitive resist film on a substrate having first region, second region, third region put between said first region and said second region;
   (2) forming a plurality of latent images of first patterns arranged regularly in said photosensitive resist film on said first region by exposing said photosensitive resist film using a first exposure mask, and
   forming unexposed regions having a size in which one or more than two of said first patterns are included and latent images of said first patterns in said photosensitive resist film on said third region;
   (3) forming a plurality of latent images of said first patterns arranged regularly in said photosensitive resist film on said second region by exposing said photosensitive resist film using a second exposure mask, and
   forming latent images of said first patterns in said unexposed regions on said third region;
   (4) forming resist masks made of said photosensitive resist film shaped with said first patterns by developing said photosensitive resist film; and
   (5) forming a plurality of second patterns arranged regularly using said resist masks by way of etching or lift-off.

2. A method according to claim 1, wherein one or more than two of said second patterns according to identical exposure mask are arranged continuously in said third region.

3. A method according to claim 1, wherein, in said third region, a boundary line between said second patterns according to said first exposure mask and said second patterns according to said second exposure mask is a zigzagged line.

4. A method according to claim 1, wherein, in said third region, regions in which one or more than two of said second patterns according to said first exposure mask are arranged continuously and regions in which one or more than two of said second patterns according to second exposure mask are arranged continuously are aligned alternatively in the direction of the lateral or vertical line of said second patterns.

5. A method of manufacturing a thin film transistor assembly device comprising the steps of:
   (1) forming a photosensitive film on a substrate having first region, second region, third region sandwiched between said first region and said second region;
   (2) forming a plurality of latent images of patterns arranged regularly in said photosensitive resist film on said first region by exposing said photosensitive resist film using a first exposure mask, and
   forming unexposed regions having a size in which one or more than two of said patterns are included and latent images of said patterns in said photosensitive resist film on said third region;
   (3) forming a plurality of latent images of said patterns arranged regularly in said photosensitive resist film on said second region by exposing said photosensitive resist film using a second exposure mask, and
   forming latent images of said patterns in said unexposed regions on said third region;
   (4) forming resist masks made of said photosensitive resist film shaped with said patterns by developing said photosensitive resist film; and
   (5) forming electrodes arranged regularly using said resist masks by way of etching or lift-off.

6. A method according to claim 5, wherein one or more than two of said electrodes according to identical exposure mask are arranged continuously in said third region.

7. A method according to claim 5, wherein, in said third region, a boundary line between said electrodes according to said first exposure mask and said electrodes according to said second exposure mask is a zigzagged line.

8. A method according to claim 5, wherein said third region includes regions according to said first exposure mask in which at least one of said electrodes are arranged continuously, and regions according to said second exposure mask in which at least one of said electrodes are arranged continuously, and said regions according to said first and second exposure masks in said third region are alternately arranged in at least one of a lateral and vertical direction of said patterns.

9. A method according to claim 5, wherein, said electrodes are sets of source and drain electrodes or gate electrodes.

10. A method of manufacturing a liquid crystal display device comprising the steps of:
    (1) forming a conductive film having first region, second region, third region sandwiched between said first region and said second region on a substrate;
    (2) forming a photosensitive resist film on said conductive film;
    (3) forming a plurality of latent images arranged regularly in said photosensitive resist film on said first region by exposing said photosensitive resist film using a first exposure mask, and
    forming unexposed regions having a size in which one or more than two of said patterns are included and latent images of said patterns in said photosensitive resist film on said third region;

(4) forming a plurality of latent images of said patterns arranged regularly in said photosensitive resist film on said second region by exposing said photosensitive resist film using a second exposure mask, and forming latent images of said patterns in said unexposed regions on said third region;

(5) forming resist masks made of said photosensitive resist film shaped with said patterns by developing said photosensitive resist film;

(6) etching said conductive film not covered with said resist masks to thus form plural sets of source and drain electrodes;

(7) forming an insulating film having openings therein on either of said source electrodes and said drain electrodes; and (8) forming pixel electrodes on said insulating film to contact either of said source electrodes and said drain electrodes via said openings in said insulating film.

11. A method according to claim 10, wherein one or more than two of said sets of source electrodes and said drain electrodes according to identical exposure mask are arranged continuously in said third region.

12. A method according to claim 10, wherein, in said third region, a boundary line between said sets of source electrodes and drain electrodes according to said first exposure mask and said sets of source electrodes and drain electrodes according to said second exposure mask is a zigzagged line.

13. A method according to claim 10, wherein said third region includes regions according to said first exposure mask in which at least one of said sets of source electrodes and drain electrodes are arranged continuously, and regions according to said second exposure mask in which at least one of said sets of source electrodes and drain electrodes are arranged continuously, and said regions according to said first and second exposure masks in said third region are alternately arranged in at least one of a lateral and vertical direction of said patterns.

14. A method according to claim 10, wherein, in regions wherein one or more than two of said sets of source electrodes and drain electrodes according to identical exposure mask are arranged continuously in said third region, a length of each of said regions along an arrangement direction of said sets of source electrodes and drain electrodes is less than pattern resolution by human eyes.

15. A method according to claim 14, wherein, in regions wherein one or more than two of said sets of source electrodes and drain electrodes according to identical exposure mask are arranged continuously in said third region, a length of each of said regions along an arrangement direction of said sets of source electrodes and drain electrodes is less than 200 μm.

16. A set of exposure mask comprising:

a first exposure mask having A-region in which a plurality of patterns are arranged regularly, and B-region adjacent to said A-region, in which said patterns and light-shielding films having sizes in which one or more than two of said patterns are included; and a second exposure mask having C-region in which a plurality of patterns are arranged regularly, and D-region adjacent to said C-region, in which said patterns and light-shielding films having sizes in which one or more than two of said patterns are included; and wherein, when said first exposure mask and said second exposure mask are aligned by overlapping said B-region with said D-region such that said patterns according to said first exposure mask and said patterns according to said second exposure mask are arranged regularly as a whole, said patterns and said light-shielding films in said B-region and D-region are arranged so as to overlap said patterns in one of said B-region and D-region with said light-shielding films in the other thereof.

17. A set of exposure mask according to claim 16, wherein, in said B-region and D-region, one or more than two of said patterns or said light-shielding films are arranged continuously.

18. A set of exposure mask according to claim 16, wherein, in said B-region and D-region, a boundary line between said patterns and said light-shielding films is a zigzagged line.

19. A set of exposure mask according to claim 16, wherein, in said B-region and D-region, regions in which one or more than two of said patterns are arranged continuously and regions in which one or more than two of said light-shielding films are arranged continuously are aligned alternatively.

20. A set of exposure mask according to claim 16, wherein said patterns have an identical shape and size.

* * * * *